(12) United States Patent
Lee et al.

(10) Patent No.: US 8,633,643 B2
(45) Date of Patent: Jan. 21, 2014

(54) LED PACKAGE, LED PACKAGE MODULE HAVING THE SAME AND MANUFACTURING METHOD THEREOF, AND HEAD LAMP MODULE HAVING THE SAME AND CONTROL METHOD THEREOF

(75) Inventors: Young Jin Lee, Seoul (KR); Hyung Kun Kim, Gyunggi-do (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 360 days.

(21) Appl. No.: 12/956,812

(22) Filed: Nov. 30, 2010

(65) Prior Publication Data
US 2011/0127912 A1    Jun. 2, 2011

(30) Foreign Application Priority Data

Nov. 30, 2009 (KR) .................. 10-2009-0116550

(51) Int. Cl.
   *H01J 1/62* (2006.01)
   *F21V 1/00* (2006.01)
   *H01L 21/00* (2006.01)
   *H01L 33/00* (2010.01)

(52) U.S. Cl.
   USPC .......... 313/498; 362/509; 438/26; 257/99; 257/E33.057

(58) Field of Classification Search
   None
   See application file for complete search history.

(56) References Cited

U.S. PATENT DOCUMENTS

| | | | |
|---|---|---|---|
| 5,198,693 A * | 3/1993 | Imken et al. ................... | 257/720 |
| 5,876,884 A * | 3/1999 | Maeda et al. ................... | 430/22 |
| 6,486,499 B1 * | 11/2002 | Krames et al. ................... | 257/81 |
| 6,614,103 B1 * | 9/2003 | Durocher et al. ............ | 257/678 |
| 6,700,692 B2 * | 3/2004 | Tonar et al. ................... | 359/265 |
| 6,882,110 B2 * | 4/2005 | Ishida et al. ................... | 315/82 |
| 6,891,200 B2 * | 5/2005 | Nagai et al. ................... | 257/88 |
| 7,256,483 B2 * | 8/2007 | Epler et al. ................... | 257/676 |
| 7,737,463 B2 * | 6/2010 | Lee et al. ......................... | 257/99 |
| 8,168,997 B2 * | 5/2012 | Joo et al. ......................... | 257/99 |
| 2005/0133808 A1 * | 6/2005 | Uraya et al. ................... | 257/99 |
| 2005/0259431 A1 | 11/2005 | Iwasaki | |
| 2007/0177401 A1 | 8/2007 | Nakabayashi | |
| 2008/0074029 A1 * | 3/2008 | Suehiro ......................... | 313/487 |
| 2010/0001309 A1 * | 1/2010 | Wang et al. ................... | 257/99 |
| 2011/0127912 A1 * | 6/2011 | Lee et al. ......................... | 315/32 |

FOREIGN PATENT DOCUMENTS

| | | | |
|---|---|---|---|
| JP | 2006066725 A | * | 3/2006 |
| JP | 2009-212367 | | 9/2009 |
| JP | 2009212367 A | * | 9/2009 |
| KR | 20-0404237 | | 12/2005 |

* cited by examiner

*Primary Examiner* — Britt D Hanley
(74) *Attorney, Agent, or Firm* — McDermott Will & Emery LLP

(57) ABSTRACT

Disclosed are an LED package, an LED package module having the same and a manufacturing method thereof, and a head lamp module having the same and a control method thereof. The light emitting diode package includes: a package substrate; a light emitting diode chip mounted on one surface of the package substrate; an electrode pad formed on the other surface of the package substrate and electrically connected to the light emitting diode chip; and a heat radiation pad formed on the other surface of the package substrate and electrically insulated from the electrode pad.

21 Claims, 17 Drawing Sheets

LED PACKAGE, LED PACKAGE MODULE HAVING THE SAME AND MANUFACTURING METHOD THEREOF, AND HEAD LAMP MODULE HAVING THE SAME AND CONTROL METHOD THEREOF

CROSS-REFERENCE TO RELATED APPLICATIONS

This application claims the benefit of Korean Patent Application No. 10-2009-0116550 filed with the Korea Intellectual Property Office on Nov. 30, 2009, the disclosure of which is incorporated herein by reference.

BACKGROUND OF THE INVENTION

1. Field of the Invention

The present invention relates to an LED package, an LED package module having the same and a manufacturing method thereof, and a head lamp module having the same and a control method thereof.

2. Description of the Related Art

With the development of light emitting diodes (hereinafter, referred to as 'LEDs'), the LEDs are being widely used even in the head lamp of an automobile. A head lamp employing LEDs may include a light source module having LEDs mounted thereon, a lamp optical module for adjusting light generated from the light source module in conformity with the head lamp of an automobile, a driving driver module for driving LEDs, and a heat radiation module used for stable operation of LEDs.

Such a light source module includes an LED package having LEDs mounted thereon, and a substrate on which LED package is to be mounted. Herein, this substrate is coupled to a heat sink, thereby emitting heat of the LEDs to the outside.

In the prior art, a Printed Circuit Board (PCB) with circuit patterns has been used as a substrate for mounting LEDs, for electrical-connection of LEDs to a driving driver module.

The use of a typical PCB results in easily electrical-connection of the LEDs to a driving driver module, but heat radiation characteristics of a light source module are remarkably reduced since an insulating layer formed on the PCB serves as thermal resistance.

Moreover, as the heat radiation characteristics get reduced, so do light amounts and life span of the LEDs. Therefore, it is impossible to apply the LEDs to a high-power head lamp required for high-level heat radiation characteristics.

Furthermore, in the prior art, a wire is used for electrical-connection between an LED package and a substrate. However, the use of the wire additionally requires a protection means for protecting the wire, and thus the unnecessary size of a module is increased and cost and time of manufacturing are increased as well.

SUMMARY OF THE INVENTION

The present invention has been proposed in order to overcome the above-described problems and it is, therefore, an object of the present invention to provide an LED package in which it is possible to improve heat radiation efficiency of a heat radiation unit in a heat radiation substrate, to provide miniaturization, and to reduce cost and time for manufacturing, an LED package module with the LED package and a manufacturing method thereof, and a head lamp module having the LED package module and a control method thereof.

In accordance with one aspect of the present invention to achieve the object, there is provided a light emitting diode package including: a package substrate; a light emitting diode chip mounted on one surface of the package substrate; an electrode pad formed on the other surface of the package substrate and electrically connected to the light emitting diode chip; and a heat radiation pad formed on the other surface of the package substrate and electrically insulated from the electrode pad.

The light emitting diode package further includes: a circuit pattern formed on the package substrate and electrically connected to the light emitting diode chip; and a via which is formed on the package substrate and allows the circuit pattern and the electrode pad to be electrically interconnected.

The package substrate includes a first substrate and a second substrate layered on the first substrate, the second substrate having the cavity formed therewithin to receive the light emitting diode chip.

The light emitting diode package further includes a glass layer for covering the cavity.

The light emitting diode package further includes a phosphor formed on an upper portion of the light emitting diode chip.

The light emitting diode chip is plural in number, the light emitting diode chips may be electrically interconnected in series to one another.

The package substrate is made of a material with ceramic.

In accordance with another aspect of the present invention to achieve the object, there is provided a light emitting diode package module including: a heat radiation substrate, which includes a heat radiation unit made of a conductive material and an electrode unit electrically insulated from the heat radiation unit; a package substrate arranged on the heat radiation substrate; a heat radiation pad formed on the package substrate to be opposite to the heat radiation unit and bonded to the heat radiation unit; an electrode pad formed on the package substrate to be opposite to the electrode unit and bonded to the electrode unit; and a light emitting diode chip mounted on the package substrate and electrically connected to the electrode pad.

A surface on which the heat radiation unit faces the heat radiation pad and a surface on which the electrode unit faces the electrode pad are virtually positioned on the same plane.

The light emitting diode module further includes a conductive adhesive layer interposed between the heat radiation unit and the heat radiation pad, and between the electrode unit and the electrode pad, respectively.

Surfaces on which the heat radiation unit and the heat radiation pad face to each other have the same size as each other, surfaces on which the electrode unit and the electrode pad face each other have the same size as each other, and the conductive adhesive layer is interposed between the surface on which the heat radiation unit and the heat radiation pad face each other, and between the surface on which the electrode unit and the electrode pad face each other, respectively.

The conductive adhesive layer is made of solder.

The conductive adhesive layer is made of paste with a buffering material.

The heat radiation substrate further comprises an insulating unit interposed between the heat radiation unit and the electrode unit.

The heat radiation unit is provided with space unit, the insulating unit is formed within the space unit, and the electrode unit is formed on the insulating unit to be opposite to the electrode pad.

The insulating unit is formed on an outer circumferential surface of the heat radiation unit, and the electrode unit is formed on the insulating unit to be opposite to the electrode pad.

The light emitting diode package module further includes an alignment mark formed on the heat radiation substrate in order to determine whether or not the package substrate is aligned with the heat radiation substrate.

The heat radiation unit is formed of a material with Cu.

The package substrate is formed of a material with ceramic.

In accordance with another aspect of the present invention to achieve the object, there is provided a head lamp module including: a light emitting diode package module for generating light; an optical module for changing distribution angle of light generated from the light emitting diode package module; a light radiation module for emitting heat of the light emitting diode package to the outside; and a driver module electrically connected to the light emitting diode package module to thereby control operation of the light emitting diode package module, wherein the light emitting diode package module includes: a heat radiation substrate which includes a heat radiation unit made of a conductive material and an electrode unit electrically insulated from the heat radiation unit; a package substrate arranged on the heat radiation substrate; a heat radiation pad formed on the package substrate to be opposite to the heat radiation unit and bonded to the heat radiation unit; an electrode pad formed on the package substrate to be opposite to the electrode unit and bonded to the electrode unit; and a light emitting diode chip mounted on the package substrate and electrically connected to the electrode pad.

In accordance with another aspect of the present invention to achieve the object, there is provided a method for controlling the head lamp module including the steps of: generating light irradiated toward the optical module by applying light-emission signals to the light emitting diode package module; and emitting heat of the light emitting diode package module to the outside by applying the light-emission signals according to change of temperature of the light emitting diode package module.

In accordance with another aspect of the present invention to achieve the object, there is provided a method for manufacturing a light emitting diode package module including the steps of: providing a heat radiation substrate which includes a heat radiation unit made of a conductive material and an electrode unit electrically insulated from the heat radiation unit; providing a package substrate on which the heat radiation pad and the electrode pad are formed to be opposite to the heat radiation unit and the electrode unit, respectively, and on which the LED chip is mounted to be electrically connected to the electrode pad; and mounting the package substrate on the heat radiation substrate through respective bonding between the heat radiation pad and the heat radiation unit, and between the electrode pad and the electrode unit.

The step of mounting the package substrate is performed by a single process.

The surface on which the heat radiation unit and the heat radiation pad face each other and the surface on which the electrode unit and the electrode pad face each other are virtually positioned on the same plane.

The step of mounting the package substrate is performed by interposing a conductive adhesive layer between the heat radiation unit and the heat radiation pad, and between the electrode unit and the electrode pad.

The surfaces on which the heat radiation unit and the heat radiation pad face each other have the same size as each other, and the surfaces on which the electrode unit and the electrode pad face each other have the same size as each other, and wherein the step of mounting the package substrate is performed by interposing the conductive adhesive layer between the surfaces on which the heat radiation unit and the heat radiation pad face each other, between the surfaces on which the electrode unit and the electrode pad face each other, respectively.

The conductive adhesive layer is made of solder, and wherein the step of mounting is performed by a surface mounting technology (SMT).

The conductive adhesive layer is made of paste with a buffering material.

The heat radiation substrate further comprises an insulating unit interposed between the heat radiation unit and the electrode unit.

The step of providing the heat radiation substrate includes the steps of: forming a space unit on the heat radiation unit; forming the insulating unit within the space unit; and forming the electrode unit on the insulating unit to be opposite to the electrode pad.

The step of providing the heat radiation substrate includes the steps of: forming the insulating unit on an outer circumferential surface of the heat radiation unit; and forming the electrode unit on the insulating unit to be opposite to the electrode pad.

The method further includes a step of determining whether or not the package substrate is aligned with the heat radiation substrate by using an alignment mark formed on the heat radiation substrate, after the step of mounting the package substrate, The heat radiation unit is made of a material with Cu.

The package substrate is made of a material with ceramic.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE PREFERABLE EMBODIMENTS

Figure 1:
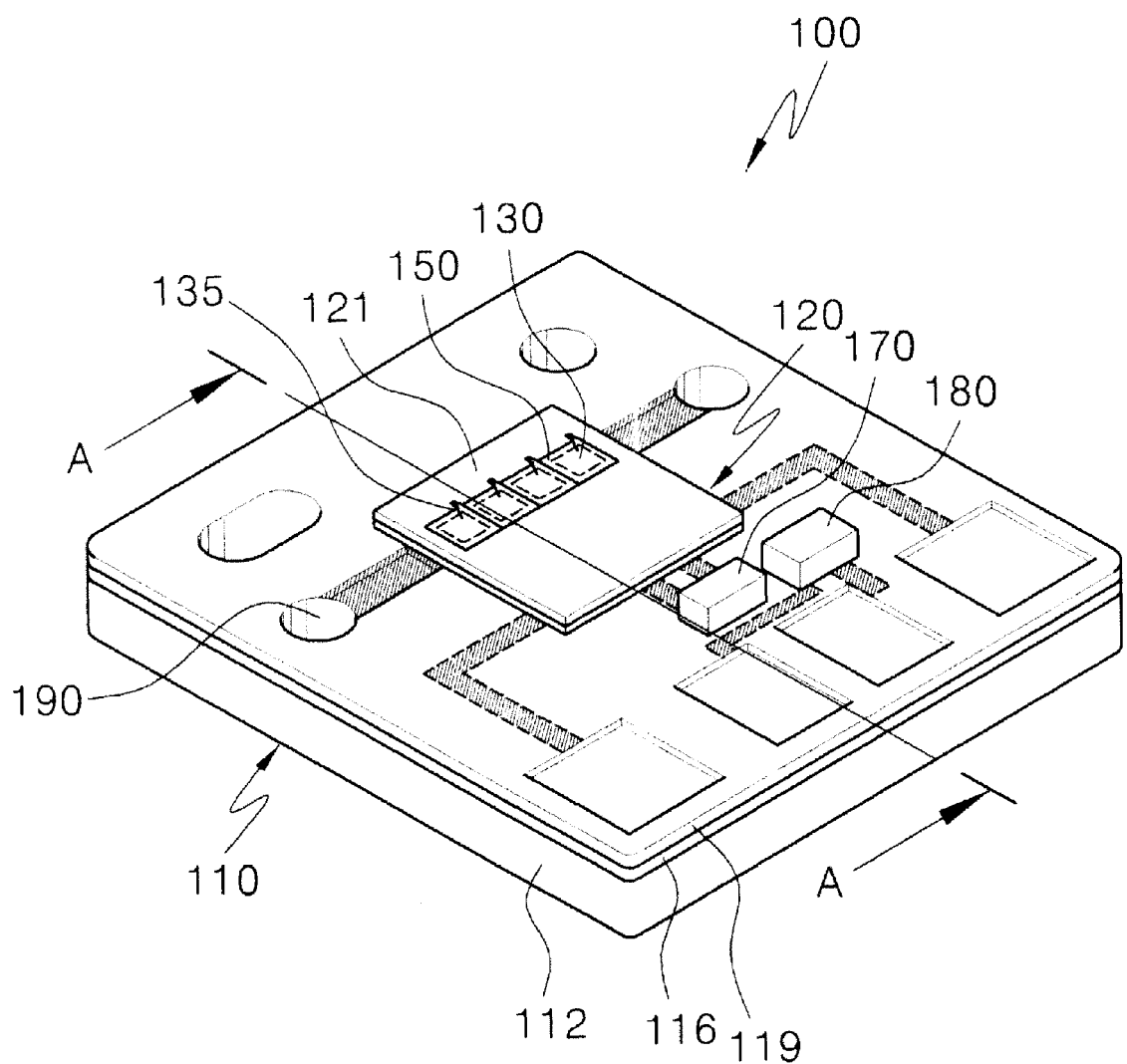
FIG. 1 is perspective view showing an LED package module of a first embodiment in accordance with one aspect of the present invention.

Embodiments of an LED package, an LED package module having the same and a manufacturing method thereof, and a head lamp module having the same and a control method thereof in accordance with the present invention will be described in detail with reference to the accompanying drawings. When describing them with reference to the drawings, the same or corresponding component is represented by the same reference numeral and repeated description thereof will be omitted.

First, a description will be given of an LED package module 100 of a first embodiment in accordance with one aspect of the present invention, with reference to FIGS. 1 to 8.

Figure 2:
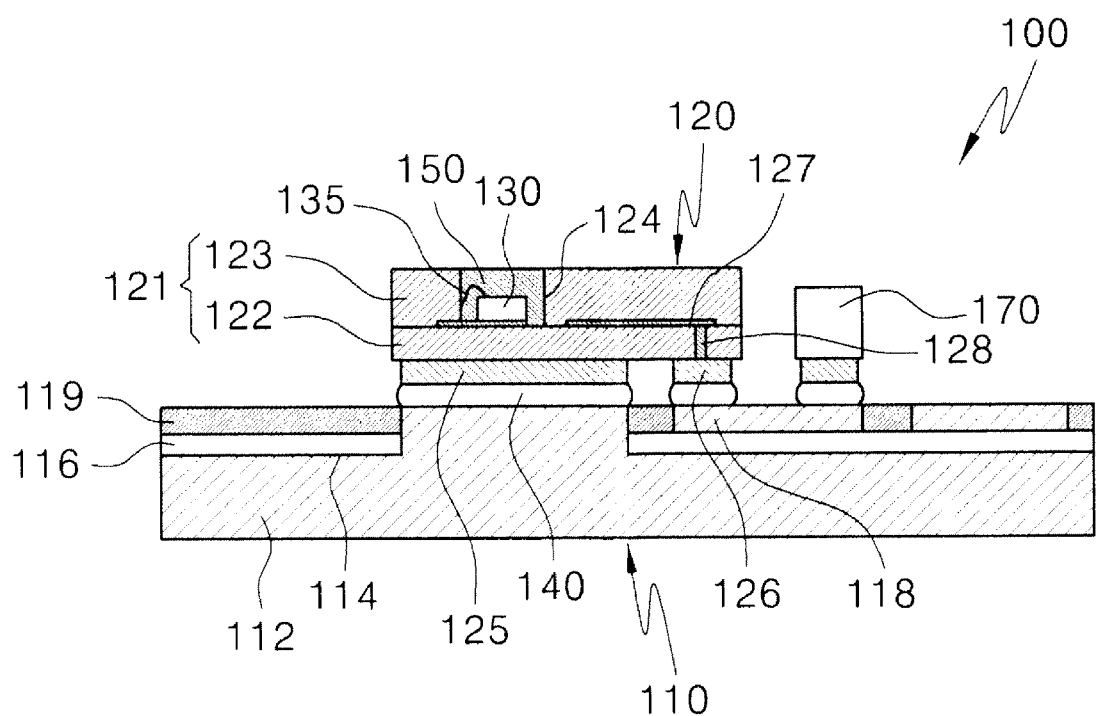
FIG. 2 is a cross-sectional view showing the LED package module taken along the line AA according to the first embodiment in accordance with one aspect of the present invention.
Figure 3:
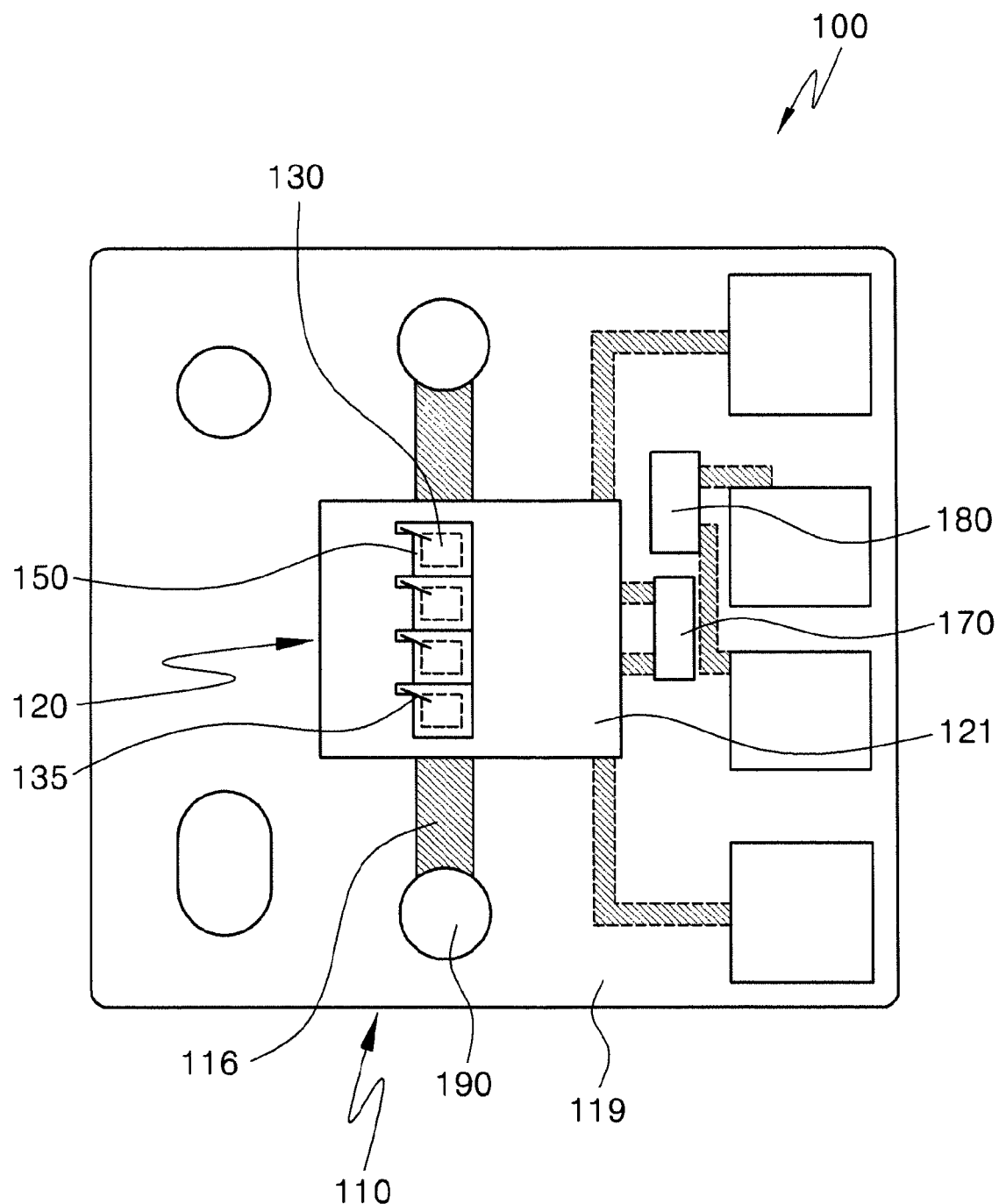
FIG. 3 is a top view showing an LED package module of the first embodiment in accordance with one aspect of the present invention.

FIG. 1 is a perspective view showing the LED package module 100 of a first embodiment in accordance with one aspect of the present invention. FIG. 2 is a cross-sectional view showing the LED package module 100 taken along the line AA of FIG. 1. FIG. 3 is a top view showing the LED package module 100 of a first embodiment in accordance with one aspect of the present invention.

According to the first embodiment in accordance with one aspect of the present invention, as shown in FIGS. 1 to 3, the LED package module 100 includes a heat radiation substrate 110, an LED package 120 which is mounted on the heat radiation substrate 110 by a conductive adhesive layer 140, a zener diode 170 and a thermister 180 each of which is mounted on the heat radiation substrate 110, and an alignment mark 190 formed on the heat radiation substrate 110.

Herein, the heat radiation substrate 110 includes a heat radiation unit 112, a space unit 114, an insulating unit 116, an electrode unit 118, and a solder resist layer 119, as shown in FIGS. 1 to 3. The LED package 120 includes a package substrate 121 composed of a first substrate 122 and a second substrate 123, a cavity 124, a heat radiation pad 125, an electrode pad 126, a circuit pattern 127, a via 128, an LED chip 130, and a phosphor 150.

In the first embodiment in accordance with one aspect of the present invention, since an insulating layer with low heat conductivity is not interposed between the package substrate 121 and the heat radiation unit 112, it is possible to remarkably increase heat radiation efficiency of the heat radiation unit 112 in the LED package 120.

Also, a wire is not separately used for electrical-connection between the LED package 120 and the electrode unit 118, so it is possible to increase reliability of electrical-connection and miniaturize the size of the LED package module 100.

Hereinafter, a detailed description will be given of respective components of the LED package module 100 of the first embodiment in accordance with one aspect of the present invention, with reference to FIGS. 1 to 8.

The heat radiation substrate 110 includes the heat radiation unit 112, the insulating unit 116, and the electrode unit 118, as shown in FIGS. 1 and 2. An exposed surface of the heat radiation unit 112 is provided with the LED package 120 mounted thereon through the conductive adhesive layer 140, the other surface of the heat radiation unit 112 is coupled with an external heat radiation body, indicated by reference numeral 22 of FIG. 8.

Figure 8:
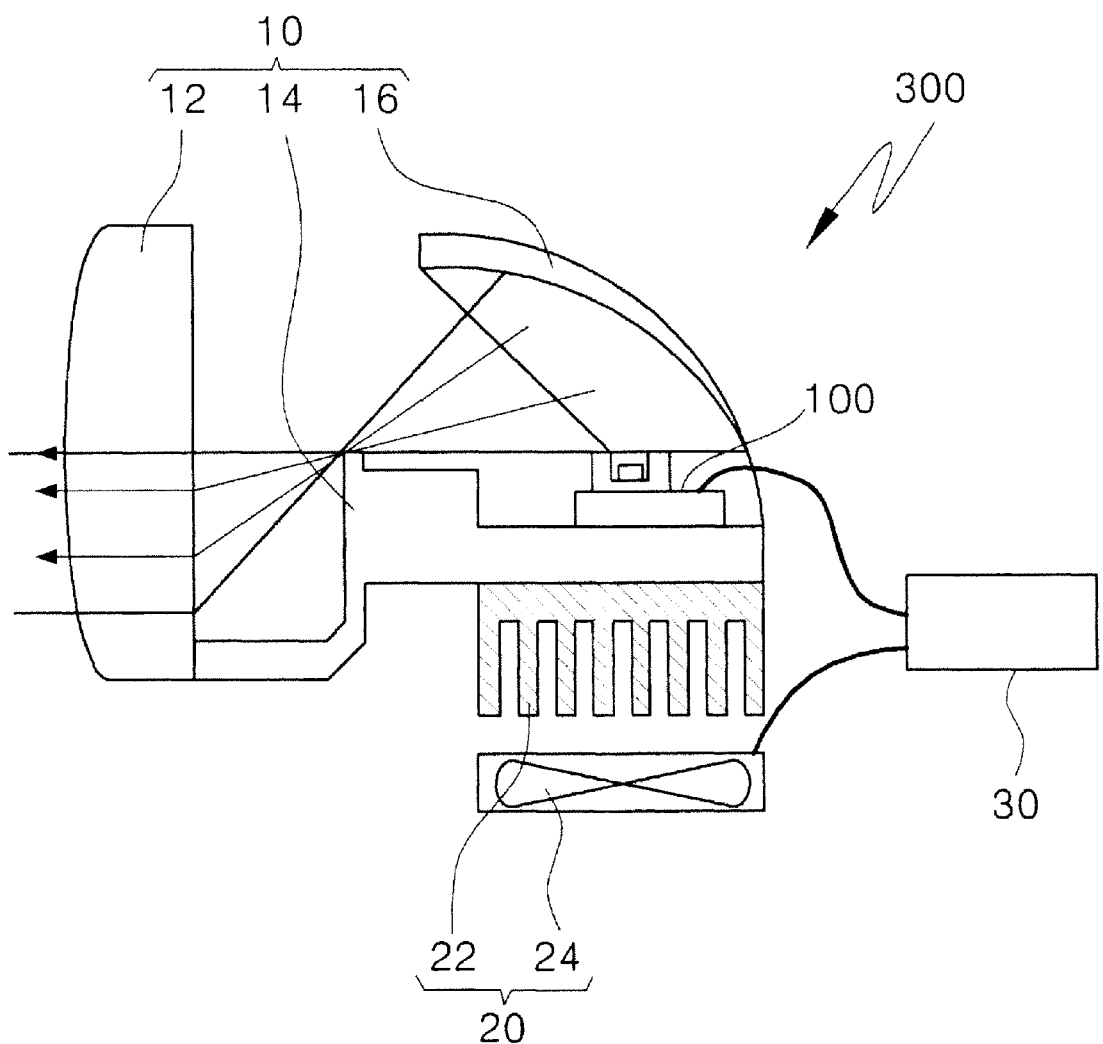
FIG. 8 is a view showing an automobile head lamp module employing the LED package module of the first embodiment in accordance with one aspect of the present invention.

Thus, heat which the LED chip 130 generates due to light emission of the LED chip 130 may be emitted to the outside through the package substrate 121, the conductive adhesive layer 140, the heat radiation unit 112, and the external heat radiation body 22 of FIG. 8. In this case, the heat radiation unit 112 is made of a conductive material, so heat generated from the LED chip 130 may be effectively transmitted to the external heat radiation body 22 of FIG. 8.

Also, the heat radiation unit 112 may be made of Cu. The heat radiation unit 112 made of Cu has a coefficient of thermal expansion slightly different from the package substrate 121 formed of ceramic material, for example, Al2O3, so although the heat radiation unit 112 and the package substrate 121 are bonded to each other by using solder, having high heat conductivity (e.g., 50K/W) but low flexibility, as the conductive adhesive layer 140, it is possible to minimize thermal stress acting on the bonded position. Therefore, it is possible to prevent breakage of the bonded position due to heat transmitted from the LED chip 130.

The heat radiation unit 112 may be made of a material, such as Al with superior heat conductivity, as well as Cu.

The electrode unit 118 may be also made of a conductive material, such as Cu, but it is electrically insulated from the heat radiation unit 112 by the insulating unit 116 interposed between the heat radiation unit 112 and the electrode unit 118, as shown in FIGS. 1 and 2. The electrode unit 118 is electrically connected to the driver module, indicated by reference numeral 30 of FIG. 8, through terminals and circuits connected to the electrode unit 118, so the electrode unit 118 is bonded to the electrode pad 126 formed on the package substrate 121 in such a manner to face the electrode unit 118. Therefore, the LED chip 130 electrically connected to the electrode pad 126 is electrically connected to the driver module 30 of FIG. 8, so it is possible to control operation of the LED chip 130 by the driver module 30 of FIG. 8.

Although the first embodiment in accordance with one aspect of the present invention has been described taking an example where the insulating unit 116 allows the heat radiation unit 112 and the electrode unit 118 to be electrically insulated from each other, the present invention is not limited thereto. It should be understood that the scope of the present includes not only this case but also a case where the heat radiation unit 112 made of electrical conductivity lower than heat conductivity is electrically insulated from the electrode unit 118 even without the insulating unit 116.

In more particular, as shown in FIG. 2, the space unit 114 is provided on a side facing the package substrate 121 of the heat radiation unit 112, and the insulating unit 116 is formed within the space unit 114, and the electrode pad 126 is formed on the electrode pad 126 in such a manner to face the electrode pad 126.

That is, as shown in FIGS. 1 and 2, the space unit 114 is formed along sides of the package substrate 121 of the heat radiation unit 112 in such a manner to have depth corresponding to a sum of thicknesses of the insulating unit 116 and the electrode unit 118. The insulating unit 116 is formed on a bottom surface of the formed space unit 114. The upper portion of the insulating unit 116 is provided with the electrode unit 118 positioned to correspond to a position of the electrode pad 126, and terminals and circuits connected to the electrode unit 118.

Thus, as shown in FIGS. 1 and 2, the heat radiation unit 112 may be exposed on the central portion of the heat radiation substrate 110, and the electrode unit 118 may be formed in such a manner to be opposite to the electrode pad 126 and be adjacent to the exposed surface of the heat radiation unit 112.

As such, the space unit 114 for formation of the insulating unit 116 and the electrode unit 118 is formed on the heat radiation unit 112, so that it is possible to form the electrode unit 118 electrically insulated from the heat radiation unit 112 and optimize the volume of the heat radiation unit 112 of being a heat medium role. Therefore, it is possible to maximize heat radiation efficiency of the LED package module 100.

In this case, as shown in FIG. 2, preferably, a surface on which the heat radiation unit 112 faces the heat radiation pad 125 and a surface on which the electrode unit 118 faces the electrode pad 126 may be virtually positioned on the same plane. That is, there is no formation of the space unit 114, and thus an exposed surface of the heat radiation unit 112 and a surface of the electrode unit 118 may be substantially the same high as each other.

Thus, when the LED package 120 is mounted on the heat radiation substrate 110, a Surface Mounting Technology (SMT) is used so that the surfaces between the heat radiation pad 125 and the heat radiation unit 112 are bonded through a single process and the surfaces between the electrode unit 118 and the electrode pad 126 are also bonded through a single process. Therefore, it is possible to reduce cost and time for manufacturing the LED package 120.

Although the first embodiment in accordance with one aspect of the present invention has been described taking an example where the surface on which the heat radiation pad 125 faces the heat radiation unit 112 and the surface on which the electrode pad 126 faces the electrode unit 118 are physically positioned on the same plane, the present invention is not limited thereto. It should be understood that the scope of the present includes not only this case, but also a case where a surface on which the heat radiation pad 125 faces the heat radiation unit 112 (i.e., an exposed surface of the heat radiation unit 112) and a surface on which the electrode pad 126 faces the electrode unit 118 (i.e., a surface of the electrode unit 118) are within range of allowable errors, so bonding of the LED package 120 is achievable by the SMT.

Additionally, there may exist a step between the heat radiation unit 112 and the electrode unit 118, since the surface on which the heat radiation pad 125 faces the heat radiation unit 112 and the surface on which the electrode pad 126 faces the electrode unit 118 are not positioned on the same plane. In this case, the conductive adhesive layer 140 between the heat radiation pad 125 and the heat radiation unit 112 is formed to have thicknesses different from that of the conductive adhesive layer 140 between the electrode pad 126 and the electrode unit 118, so that it is possible to bond the heat radiation pad 125 and the heat radiation unit 112, and the electrode pad 126 and the electrode unit 118 regardless of the step.

As shown in FIGS. 1 and 2, the solder resist layer 119 may be formed on portions remaining except for portions of the circuits through which the zener diode 170 and the thermister 180 are to be electrically connected, wherein the circuits are connected to the insulating unit 116 and the electrode unit 118. The LED package 120 may include a package substrate 121 composed of the first substrate 122 and the second substrate 123, the cavity 124, the heat radiation pad 125, the electrode pad 126, the circuit pattern 127, the via 128, the LED chip 130, and the phosphor 150, as shown in FIGS. 1 to 3.

As shown in FIGS. 1 and 3, the package substrate 121 is arranged on the heat radiation substrate 110 and is composed of the first substrate 122 and the second substrate 123 layered on the first substrate 122. The inner side of the second substrate 123 is provided with a cavity 124 formed to have a size greater than that of the LED chip 130 in such a manner to receive the LED chip 130.

The package substrate 121 is made of a ceramic material, and thus it can have high heat-resistance, superior heat conductivity, and high reflective efficiency characteristics. Therefore, the package substrate 121 has an advantage in that it can be applied to the LED package 120 for the high-power automobile head lamp module, indicated by reference numeral 300 of FIG. 8, required for high heat-radiation characteristics.

Figure 9:
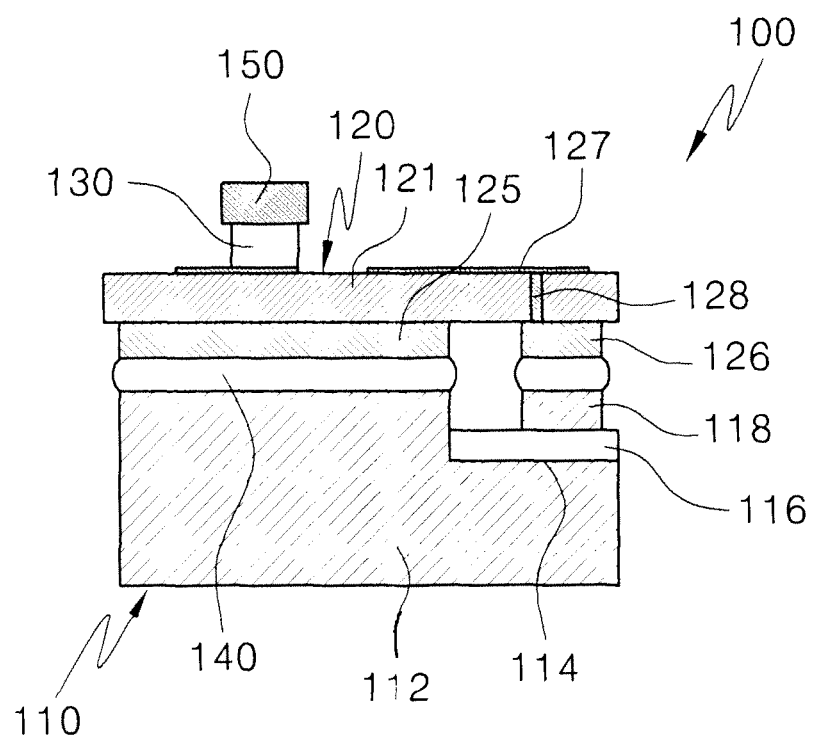
FIGS. 9 to 13 are cross-sectional views showing the LED package module in accordance of a second embodiment in accordance with one aspect of the present invention, respectively.
Figure 10:
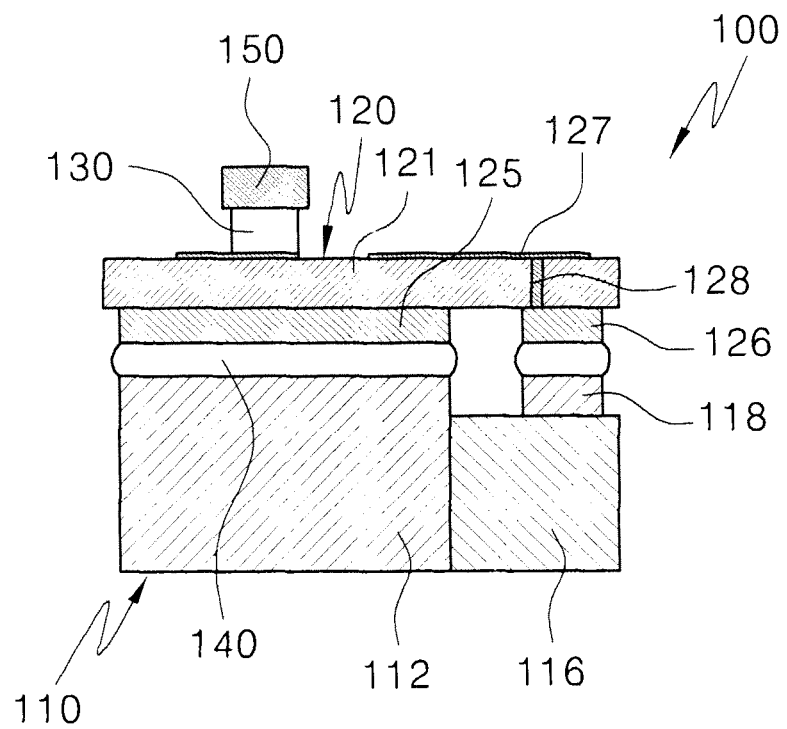
Figure 11:
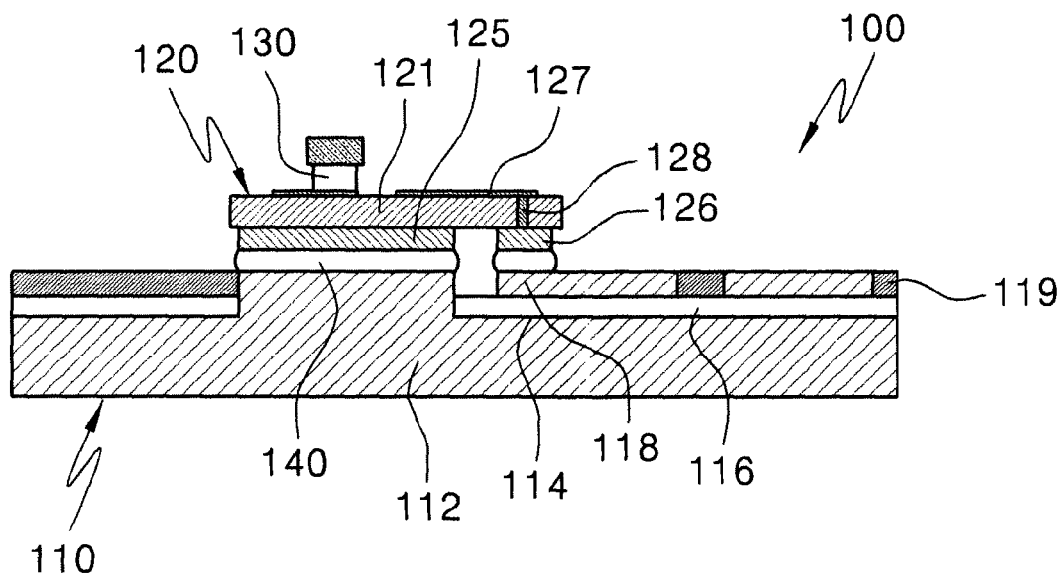

Meanwhile, the package substrate 121 may be formed to become a single layer, differently from the first embodiment of the present invention, which is shown in FIGS. 9 to 11. Although not shown in drawings, this case corresponds to a case where the LED chip 130 is bonded to the package substrate 121 in a flip-chip scheme, which is to be described in more detail in a second embodiment in accordance with one aspect of the present invention with reference to FIGS. 9 to 11.

As shown in FIG. 2, the circuit pattern 127 is formed on the package substrate 121 in such a manner to be electrically connected to the LED chip 130. That is, the circuit pattern 127 is formed between the first substrate 122 and the second substrate 123 of the package substrate 121, and is bonded to an electrode formed on a lower surface of the LED chip 130 to thereby be electrically connected to the LED chip 130. An electrode formed on an upper surface of the LED chip 130 may be electrically connected to the circuit pattern 127 by the wire 135.

As shown in FIG. 2, the via 128 is formed on the package substrate 121 in such a manner to play a role of electrical-connection of the circuit pattern 127 to the electrode pad 126. That is, the via 128 is formed within the first substrate 122 in such a manner to allow the circuit pattern 127 interposed between the first substrate 122 and the second substrate 123 to be electrically connected to the electrode pad 126 formed on a surface of the first substrate 122, thereby electrically connecting the LED chip 130 to the electrode unit 118.

Figure 4:
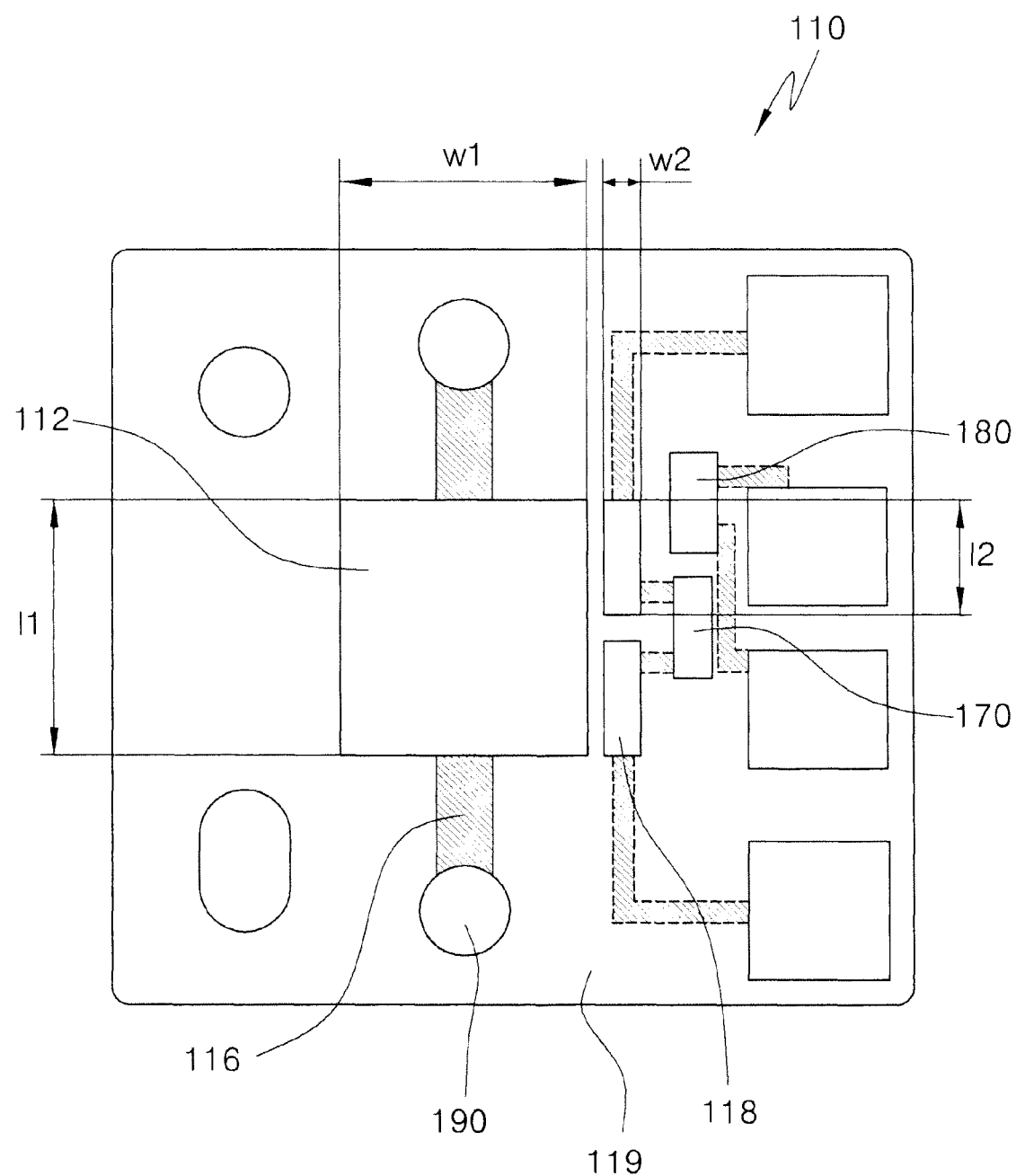
FIG. 4 is a top view showing a heat radiation substrate in the LED package module of the first embodiment in accordance with one aspect of the present invention.
Figure 5:
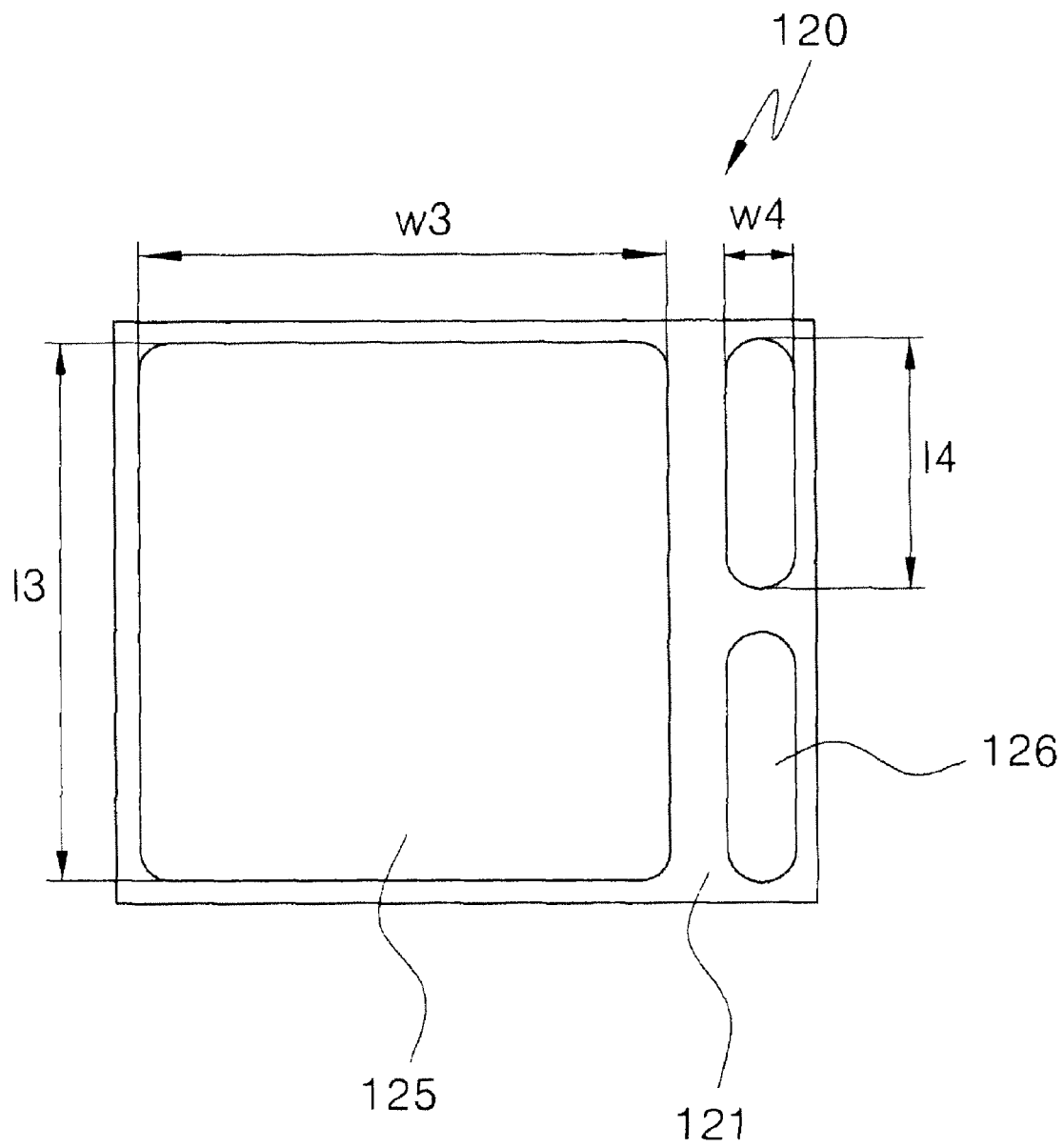
FIG. 5 is a bottom view showing a LED package in the LED package module of the first embodiment in accordance with one aspect of the present invention.

FIG. 4 is a top view showing the heat radiation substrate 110 in the LED package module 100 of the first embodiment in accordance with one aspect of the present invention. FIG. 5 is a bottom view showing the LED package 120 in the LED package module 100 of the first embodiment in accordance with one aspect of the present invention.

As shown in FIG. 2, and FIGS. 4 and 5, the heat radiation pad 125 is formed on the package substrate 121 in such a manner to face the heat radiation unit 112 and is bonded to the heat radiation unit 112. The heat radiation pad 125 is formed on a lower surface of the package substrate 121 in such a manner to be electrically insulated from the electrode pad 126, and is positioned to correspond to an exposed surface of the heat radiation unit 112. The heat radiation pad 125 is bonded to the exposed surface of the heat radiation unit 112 through conductive adhesive layer 140 (i.e., solder).

The heat radiation pad 125 is bonded to the heat radiation unit 112 even without an insulating layer interposed between the package substrate 121 and the heat radiation unit 112, so that it is possible to effectively transmit heat of the LED chip 130 from the heat radiation pad 125 to the heat radiation unit 112 without thermal resistance. As a result, it is possible to remarkably improve heat radiation characteristics of the LED package module 100.

As used herein, the bonding means not only that two components are coupled to each other through physically direction contact, but also that the components are coupled to each other through other materials interposed therebetween. The second embodiment of the present invention has been described taking an example where the conductive adhesive layer 140 is interposed between two components (i.e., between the heat radiation pad 125 and the heat radiation unit 112, and between the electrode pad 126 and the electrode unit 118) in such a manner that the heat radiation pad 125 and the heat radiation unit 112, and the heat radiation unit 112 and the electrode pad 126 are indirectly coupled to one another through the conductive adhesive layer 140, respectively.

As shown in FIG. 2 and FIGS. 4 and 5, the electrode pad 126 is formed on the package substrate 121 in such a manner to be opposite to and be bonded to the electrode unit 118. A pair of the electrode pads 126 is formed on a lower surface of the package substrate 121, and is spaced apart from the heat radiation pad 125 in such a manner to be electrically insulated from the heat radiation pad 125. The electrode pad 126 is formed to correspond to the position of the electrode unit 118, and is coupled to the electrode pad 126 through bonding of the conductive adhesive layer 140 (i.e., solder).

As such, since the electrode pads 126 are directly bonded to the electrode unit 118 through the solder instead of a wire, the bonding scheme of the present invention has advantages over the wire bonding scheme in the prior art. That is, it is possible to provide simplified manufacturing processes and downsizing of the LED package module 100, and connection-reliability between the electrode unit 118 and the electrode pads 126.

That is, in the case where electrical-connection is implemented by the wire bonding scheme in the prior art, it is necessary to perform not only a wire bonding process, but also a process for packing periphery of the wire by using a material (e.g., rubber, and so on) in order to protect a connected position of the wire. However, in the embodiment of the present invention, the non-use of the wire itself results in omission of such an additional process.

Also, in the prior art, a protection means (e.g., rubber, and so on) used to pack a wire unnecessarily occupies space. However, in the embodiment of the present invention, non-use of the wire bonding scheme does not cause the unnecessary space.

As described above, the electrode pad 126 and the heat radiation pad 125 are bonded to the electrode unit 118 and the heat radiation unit 112 by an SMT, respectively, thereby more effectively reducing cost and time required for manufacturing.

In the embodiment of the present invention, the electrode unit 118 is stably bonded to the electrode pad 126 by not a wire, but the conductive adhesive layer 140 (i.e., solder). In this case, the solder has high conductivity (e.g., 50K/W), so that it is possible to remarkably improve connection reliability of the LED package module 100 compared with the conventional wire bonding scheme.

As shown in FIG. 2, the conductive adhesive layer 140 is interposed not only between the heat radiation unit 112 and the heat radiation pad 125, but also between the electrode unit 118 and the electrode pad 126. Herein the conductive adhesive layer 140 may be made of solder. As described above, since the solder has high conductivity (e.g., 50K/W), it is possible to effectively transmit not only heat between the heat radiation pad 125 and the heat radiation unit 112, but also electrical signals between the electrode pad 126 and the electrode unit 118.

In the embodiment of the present invention, the heat radiation unit 112 is formed of Cu with a coefficient of thermal expansion similar to that of the package substrate 121 made of ceramics, so it is possible to minimize thermal stress acting on each of interfaces between the heat radiation unit 112 and the conductive adhesive layer 140 and between the package substrate 121 and the conductive adhesive layer 140 even if flexibility of the solder is insufficient, which results in prevention of damage in a position where the heat radiation unit 112 is bonded to the package substrate 121.

Meanwhile, as shown in FIGS. 4 and 5, the sizes of surfaces on which the heat radiation unit 112 and the heat radiation pad 125 face each other are substantially the same as each other, and the sizes of surfaces on which the electrode unit 118 and the electrode pad 126 face each other are also substantially the same as each other. As shown in FIG. 2, the conductive adhesive layer 140 is interposed between the surfaces on which the heat radiation unit 112 and the heat radiation pad 125 face each other, and between the surfaces on which the electrode unit 118 and the electrode pad 126 face each other, respectively.

In more particular, the size of an exposed surface of the heat radiation unit 112 provided as a surface opposite to the heat radiation pad 125 (that is, width w1 and length l1 shown in FIG. 4) is the same as that of a surface of the heat radiation pad 125 opposite to the heat radiation unit 112 (that is, width w3 and length l3 shown in FIG. 5). The size of a surface of the electrode unit 118 opposite to the electrode pad 126 (that is, width w2 and length l2 shown in FIG. 4) is the same as that of the surface of the electrode pad 126 opposite to the electrode unit 118 (that is, width w4 and length l4).

The conductive adhesive layer 140 is uniformly interposed between entire interposed surfaces (i.e., surfaces on which the heat radiation unit 112 and the heat radiation pad 125 face each other, and surfaces on which the electrode unit 118 and the electrode pad 126 face each other) to thereby achieve bonding of these surfaces.

As such, the sizes of bonded surfaces by the conductive adhesive layer 140 are substantially the same as each other, so that a so-called self-align of the LED package 120 is achievable on the heat radiation substrate 110. Therefore, during a manufacturing process, it is unnecessary to prepare a separate jig for fixing the LED package 120 on a predetermined position, and a separate align mark used to align the LED package 120.

That is, the SMT is used so that the melted conductive adhesive layer 140 (i.e., solder) is coated on surfaces of a pair of the electrode units 118 and an exposed surface of the heat radiation unit 112 opposite to the heat radiation pad 125. Thereafter, when the LED package 120 is mounted on the solder in such a manner that the heat radiation pad 125 and a pair of the electrode pads 126 are opposite to the exposed surface of the heat radiation unit 112 and the electrode unit 118, three bonding positions are stably made between the LED package 120 and the heat radiation substrate 110 by the melted solder since the heat radiation pad 125 and a pair of the electrode pad 126 have the same size as that of the exposed surface of the heat radiation unit 112 and a pair of the electrode unit 118, respectively.

That is, since the heat radiation pad 125 and a pair of the electrode pads 126 are positioned to be opposite to the heat radiation unit 112 and the electrode unit 118, respectively, and their sizes are substantially the same as one another, a surface tension of the melted solder stably acts on the three bonded positions. Therefore, even if external load is applied to the LED package 120 before the solder is cured, there occurs a slight movement of the LED package 120, and then the LED package 120 is placed back on an original position, so that it is possible to keep the position of the LED package 120 unchanged.

The LED chip 130 is a semiconductor device which can emit light with various colors by means of light emitting sources obtained through the change of the compound semiconductor materials, such as GaAs, AlGaAs, GaN, InGaInP, and so on. As shown in FIGS. 1 to 3, the LED chip 130 is mounted on the upper surface of the package substrate 121, and is electrically connected to the electrode pad 126. That is, the LED chip 130 is received within the cavity 124 formed on the upper surface of the package substrate 121, and is electrically connected to the circuit pattern 127 exposed toward the bottom surface of the cavity 124.

Figure 6:
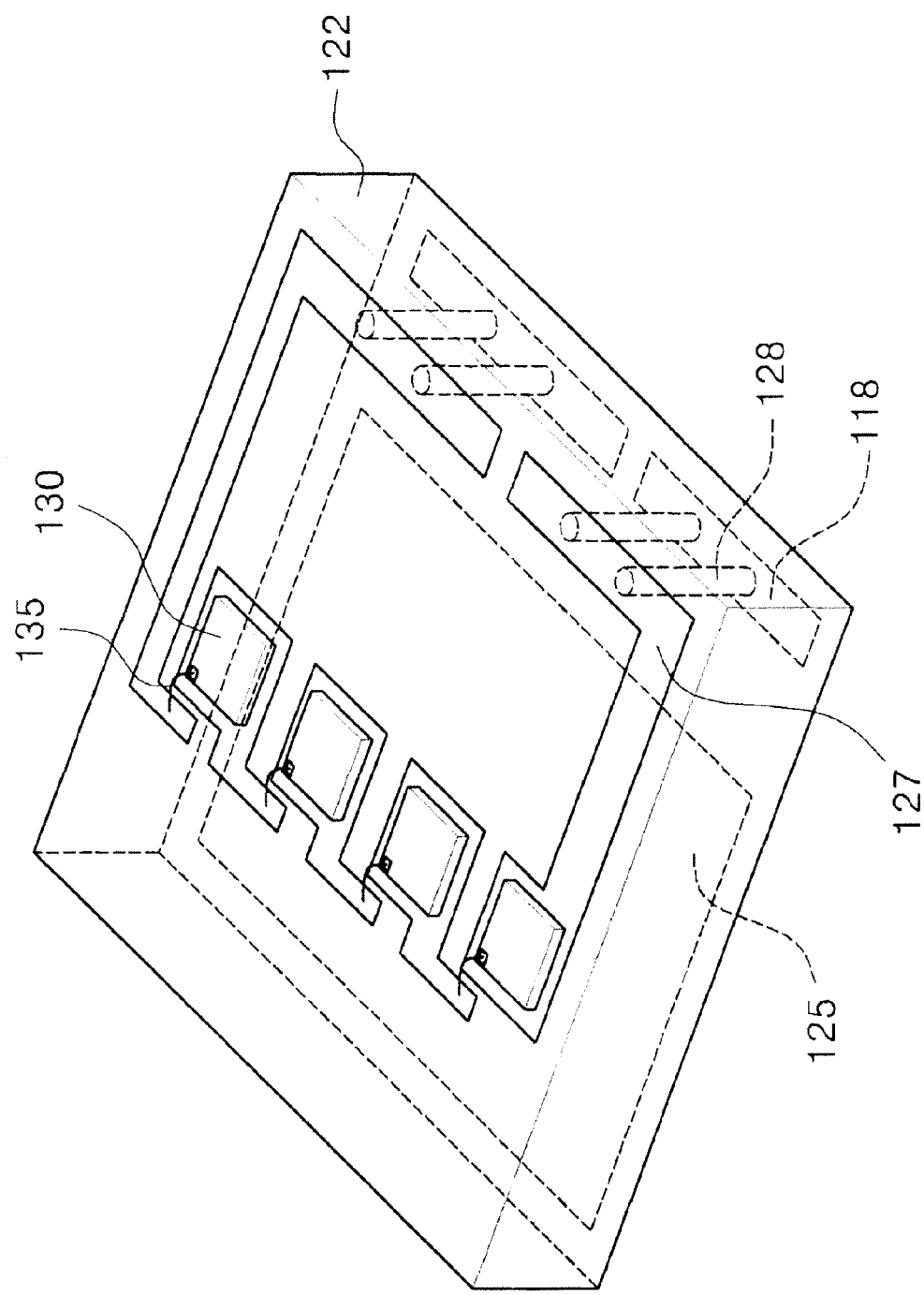
FIG. 6 is a perspective view showing an electrical-connection state and a circuit pattern arrangement of the LED chips in the LED package module of the first embodiment in accordance with one aspect of the present invention.

FIG. 6 is a perspective view showing an electrical connection state and a circuit pattern arrangement of the LED chip 130 according to the first embodiment of the LED package module 100 in accordance with one aspect of the present invention.

Referring to FIG. 6, an electrode of the lower portion of the LED chip 130 may be bonded to the circuit pattern 127 to thereby be electrically connected to the circuit pattern 127. An electrode of the upper portion of the LED chip 130 may be bonded to the circuit pattern 127 in a wire bonding scheme employing the wire 135. In this case, the circuit pattern 127 is electrically connected to the electrode unit 118 through the via 128. The heat radiation pad 125 is formed on the lower portion of the first substrate 122, and plays only a role of heat transmission and is electrically insulated from the electrode unit 118 and the circuit pattern 127.

As shown in FIG. 6, a plurality of LED chips 130 is arranged in a row, and may be electrically connected in series to one another by the circuit pattern 127 and the wire 135. As such, the arrangement of the LED chips 130 in a row is advantageous to satisfaction of light distribution of the automobile head lamp module (indicated by reference numeral 300 of FIG. 8) required for transverse distribution in both sides. The serial connection of the LED chips 130 requires relatively lower current with respect to the same power, so the LED package module 100 can be more easily applied to the head lamp module for the automobile 300 of FIG. 8.

Although the embodiment of the present invention has been described taking an example where the LED chips 130 are serially connected to one another, it should be understood that the present invention is not limited to the embodiment and includes all cases where one or more of the LED chips 130 are electrically connected in various manners, such as serial-connection, parallel-connection, and serial/parallel connection.

As shown in FIGS. 1 to 3, the phosphor 150 is formed on the upper portion of the LED chip 130. That is, the cavity 124 in which the LED chip 130 is mounted is filled with the phosphor 150, and plays a role of protection of the LED chip 130, as well as a role of converting light generated from the LED chip 130 into white light.

As shown in FIGS. 1 to 3, the zener diode 170 is mounted on the heat radiation substrate 110. The zener diode 170, which is a semiconductor device for preventing damage of the LED chip 130 due to electrostatic, is electrically connected to a pair of the electrode units 118 formed on the heat radiation substrate 110.

As shown in FIGS. 1 to 3, the thermister 180 is mounted on the heat radiation substrate 110. The thermister 180, which is a semiconductor device for controlling temperature of the LED package module 100, is electrically connected to an external controller (not shown) through circuits and terminals.

Figure 7:
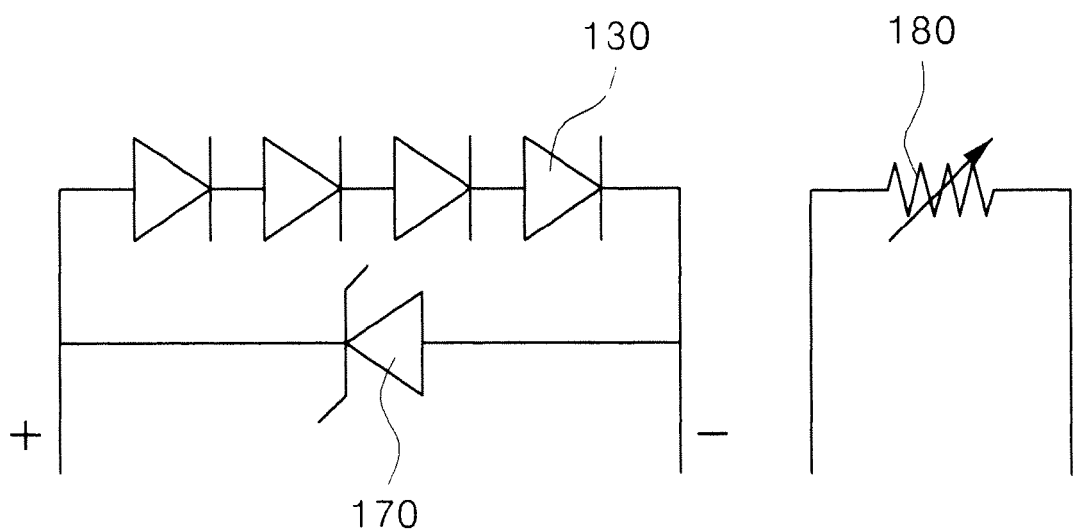
FIG. 7 is a circuit diagram showing an electrical-connection state of the LED chips, a zener diode, and thermister of the LED package module of the first embodiment in accordance with one aspect of the present invention.

FIG. 7 is a circuit diagram showing an electrical-connection state of the LED chip 130, the zener diode 170, and the thermister 180 in the LED package module 100 of the first embodiment in accordance with one aspect of the present invention.

As shown in FIG. 7, the zener diode 170 and a plurality of the LED chip 130 serially connected to one another are connected in parallel to one another in a polarity opposite to one another through the electrode unit 118. The thermister 180 has such a circuit configuration as to be independently connected to the LED chip 130 and the zener diode 170, so that the thermister 180 can be used in controlling temperature of the LED package module 100.

As shown in FIGS. 1 to 3, the alignment mark 190 is formed on the heat radiation substrate 110 for determination of alignment or non-alignment of the package substrate 121 with the heat radiation substrate 110. The LED package 120 is mounted on the heat radiation substrate 110 by the conductive adhesive layer 140, that is, solder. Thereafter, in order to recognize alignment of the heat radiation substrate 110 with light emitting diode package 120 with his/her eyes, in particular, the alignment of the LED chip 130, a through hole is formed on both sides of the heat radiation substrate 110, as alignment mark, and the solder resist layer 119 on areas extended horizontally toward the exposed surface of the heat radiation unit 112 from the through hole is removed and thus the insulating unit 116 is partially exposed.

As described above, parts of the solder resist layer 119 may be removed so as to expose the insulating unit 116. Alternatively, a separate material may be printed on the solder resist layer 119.

The alignment mark 190 of the embodiment in the present invention is merely used as means for recognizing alignment state at final stage of the manufacturing process. Therefore, the alignment mark 190 is not for alignment of the LED package 120 during the manufacturing process, so it should be understood that self-alignment of the LED package 120 is achievable due to existence of the alignment mark 190.

FIG. 8 is a view showing an automobile head lamp module 300 employing the LED package module 100 of an embodiment in accordance with one aspect of the present invention.

By using the LED package module 100 of the embodiment of the present invention, as shown in FIG. 8, it is possible to implement the automobile head lamp module 300. The automobile head lamp module 300 includes an optical module 10, a heat radiation module 20, and a driver module 30, in addition to the LED package module 100. The optical module 10 converts a light-distribution angle of light generated from the LED package module 100 into a desired angle by being constructed to include a frame 14 for supporting the LED package module 100, a reflector 16 for reflecting light generated from the LED package module 100, and a lens 12 for refracting light reflected from the reflector 16 at a desired angle. The heat radiation module 20 emits heat generated from the LED package module 100 to the outside by being constructed to include a heat radiation body 22 coupled to a lower portion of the LED package module 100, and a fan 24 for dissipating heat of the LED package module 100 to the outside. The driver module 30 is electrically connected to the LED package module 100 and the fan 24 to thereby control their operation.

As such, the automobile head lamp module 300 shown in FIG. 8 can be applicable as a downward lamp of the automobile, and it may be arranged on the frame 14 in such various angles and positions as to be changeable according to light-distribution of four LED package modules 100.

Also, the LED package module 100 of the embodiment of the present invention may be used as an upward lamp of the automobile. In this case, the reflector 16 shown in FIG. 8 is omitted, and the angle and position of the LED package module 100 are changed so that light generated from the LED package module 100 travels directly toward the lens 12. In the case of the upward lamp, loss of light is not so much due to omission of the reflector 16, so the number of the LED package modules 100 may be reduced as compared with that of the downward lamps.

The head lamp module 300 may be controlled by the following operation of the driver module 30.

First, light emission signals are applied to the LED package module 100 to thereby generate light irradiated toward the optical module 10.

That is, as shown in FIG. 8, since the driver module 30 is electrically connected to the LED package module 100, the driver module 30 receives electrical operation signals supplied from the switch, and then applies electrical light emission signals to the LED package module 100 when a user wants to drive the head lamp module 300 through a switch lamp.

When the light emission signals are applied to the LED package module 100, the LED package module 100 may be driven and thus emits light. Such light may be irradiated on the optical module 10, and be emitted to the outside after reflection and refraction.

Thereafter, heat radiation signals are applied to the heat radiation module 200 according to the change of temperature of the LED package module 100 to thereby emit heat of the LED package module 100 to the outside.

That is, as shown in FIG. 8, the driver module 30 is electrically connected to the LED package module 100 and the heat radiation module 20, and the thermistor 180 for sensing temperature may be mounted on the LED package module 100, as shown in FIGS. 1 and 2.

Since the thermistor 180 may be also electrically connected to the driver module 30, the driver module 30 applies electrical heat radiation signals to the heat radiation module 20 (in more particular, fan 24) when the thermistor 180 senses change of temperature of the LED package module 100 and transmits electrical temperature signals corresponding to the sensed temperature to the driver module 30.

When the heat radiation signals are applied to the heat radiation module 20, the fan 24 of the heat radiation module 20 is driven to thereby emit heat of the LED package module to the outside.

Hereinafter, a description will be given of the LED package module 100 of other embodiments in accordance with one aspect of the present invention with reference to FIGS. 9 to 13.

FIGS. 9 to 13 are cross-sectional views showing the LED package module 100 of other embodiment in accordance with one aspect of the present invention, respectively.

Hereinafter, each of the embodiments shown in FIGS. 9 to 13 will be mainly described with components different from those of the aforementioned embodiments, except for the components or function thereof similar to those of the aforementioned embodiments.

FIG. 9 shows an LED package module 100 in which the package substrate 121 is constructed to be in a single layer and paste is used as the conductive adhesive layer 140.

In the embodiment of the present invention, as shown in FIG. 9, the package substrate 121 is constructed to be a single layer, and the LED chip 130 is mounted on the package substrate 121 in such a manner to be exposed to the outside.

Although not shown in drawings, the LED chip 130 may be bonded to the circuit pattern 127 in a flip chip scheme, so it is unnecessary to prepare a wire for electrical connection of the LED chip 130 to the circuit pattern 127.

Therefore, in the embodiment of the present invention, it is necessary to form a fluorescent layer only on the upper portion of the LED chip 130, but it is unnecessary to additionally prepare the cavity 124 for receiving the LED chip 130. As a result, in the embodiment of the present invention, since a separate construction for protection of the LED chip 130 and the wire is omitted, it is possible to more simply construct the LED package module 100, and thus to reduce processes, cost, and time for manufacturing.

Also, in the case of the embodiment of the present invention, the conductive adhesive layer 140 may be paste with a buffering material. Thus, since the paste is made of the flexible buffering material even if a coefficient of thermal expansion of the heat radiation unit 112 is slightly different from that of the package substrate 121 made of ceramics, the LED package module 100 can be prevented from being damaged, for the conductive adhesive layer 140 may serve as buffering between the heat radiation unit 112 and the package substrate 121 even though they are differently expanded due to heat of the LED chip 130.

In the embodiment of the present invention, the heat radiation unit 112 may be formed in a shape slightly different from that of the aforementioned embodiment. That is, the space unit 114 may be formed on one side of edges in areas where the space unit 114 faces the package substrate 121, instead of entire edges in areas where the space unit 114 faces the package substrate 121. Also, if the insulating unit 116 and the electrode unit 118 can be formed, it is possible to form the space unit 114 in various shapes, as well as in the above-described shape.

FIG. 10 shows an LED package module 100 in which the package substrate 121 is constructed to be a single layer, paste is used as the conductive adhesive layer 140, and the insulating unit 116 is formed on an outer circumferential surface of the heat radiation unit 112.

Since the description has been given of the package substrate 121 and the conductive adhesive layer 140 in the embodiment of the FIG. 9, the description thereof will be omitted and will be mainly described with the structure of the heat radiation unit 112 and the insulating unit 116.

In the case of the embodiment of the present invention, as shown in FIG. 10, the insulating unit 116 is formed on the outer circumferential surface of the heat radiation unit 112, and the electrode unit 118 is formed on the insulating unit 116 in such a manner to face the electrode pad 126. That is, the insulating unit 116 is formed around the heat radiation unit 112 without separate formation of the space unit (indicated by reference numeral 114 of FIG. 9) on the heat radiation unit 112. On the outer circumferential surface of the heat radiation unit 112, the insulating unit 116 is formed to have a height except for thickness enough to form the electrode unit 118.

In the embodiment of the present invention, since a process for manufacturing the space unit 114 on the heat radiation unit 112 may be omitted, it is possible to reduce cost and time required for manufacturing the LED package module 100.

Although the embodiment of the present invention has been described taking an example where the insulating unit 116 is formed on one side of the outer circumferential surface of the heat radiation unit 112, the present invention is not limited thereto. It should be understood that the insulating unit 116 may be formed to surround the heat radiation unit 112 along the outer circumferential surface of the heat radiation unit 112, and may be also structured in various manners if there exists positions where the electrode unit 118 electrically insulated from the heat radiation unit 112 is to be formed.

Meanwhile, in the case of embodiments in FIGS. 9 and 10, the solder resist layer (indicated by reference numeral 119 of FIG. 2), the zener diode (indicated by reference numeral 170 of FIG. 2), and the thermister (indicated by reference numeral 180 of FIG. 1) are not shown, but it should be understood that these embodiments of FIGS. 9 and 10 also include these components.

FIG. 11 shows an LED package module 100 in which the package substrate 121 is constructed to be a single layer.

In the case of the embodiment of the present invention, as shown in FIG. 11, the package substrate 121 is formed to be a single layer, and the LED chip 130 is mounted on the package substrate 121 and is exposed to the outside. Then, the solder resist layer 119 on the position corresponding to a space between the heat radiation pad 125 and the electrode pad 126 is partially removed.

As described in the embodiment of FIG. 9, the LED chip 130 may be bonded in a flip chip scheme, so that it is unnecessary to protect a wire used for electrical connection of the LED chip 130 to the circuit pattern 127.

Therefore, as in the embodiment of the present invention, in the embodiment of FIG. 9, it is necessary to merely form the fluorescent layer on the upper portion of the LED chip 130 without having to separately prepare cavity 124 for receiving the LED chip 130. Thus, it is possible to more simply structure the LED package module 100 and thus to reduce cost and time required for manufacturing.

As shown in FIG. 11, the solder resist layer 119 on the position corresponding to a space between the heat radiation pad 125 and the electrode pad 126 may be partially removed. That is, the solder resist layer 119 interposed between the exposed heat radiation unit 112 and the electrode unit 118 is removed, and thus the insulating unit 116 formed on the lower portion thereof is exposed, which results in formation of a step with a predetermined height on the surface thereof.

During a process for mounting the LED package 120 on the heat radiation substrate 110, less-cured conductive adhesive layer 140 which is coated on each of the exposed heat radiation unit 112 and the electrode unit 118 of the heat radiation substrate 110, that is, melted solder, flows along the surface of the solder resist layer 119 and is mixed, which possibly causes electrical short between the electrode unit 118 and the heat radiation unit 112.

However, in the embodiment of the present invention, removal of the solder resist layer 119 interposed between the exposed heat radiation unit 112 and the electrode unit 118 brings out formation of the step, so it is possible to prevent electrical-short between the electrode unit 118 and the heat radiation unit 112 even if the conductive adhesive layer 140 coated with slightly larger amount than a set amount of the conductive adhesive layer 140, that is, solder, flow beyond the surface of the heat radiation unit 112 and the electrode unit 118, for the redundant amount of the conductive adhesive layer 140 is prevented from being mixed and flows into the space formed by removal of the solder resist layer 119 by the step.

Figure 12:
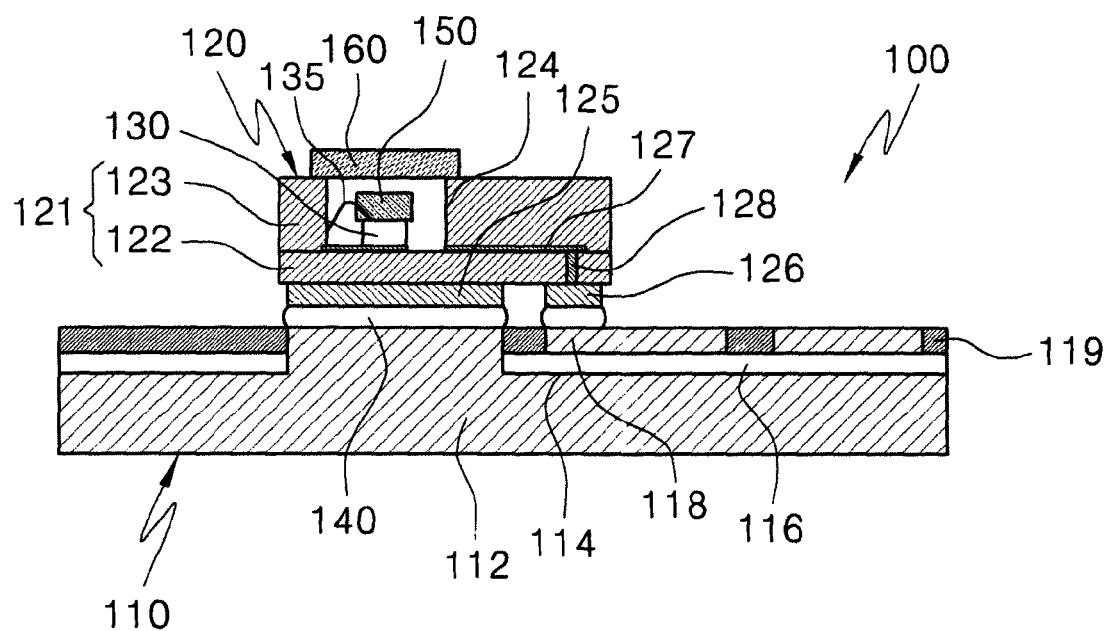

FIG. 12 shows an LED package module 100 in which the cavity 124 of the package substrate 121 is covered by a glass layer 160.

In the case of the embodiment of the present invention, as shown in FIG. 12, the glass layer 160 covers the cavity 124. As shown in FIG. 12, the fluorescent layer is formed only the upper portion of the LED chip 130, so the wire 135 used to implement electrical-connection between the LED chip 130 and the circuit pattern 127 is exposed to the cavity 124. Thus, the glass layer 160 is additionally layered on the upper portion of the cavity 124, thereby stably protecting the LED chip 130 and the wire 135 even if the cavity 124 is not filled with the phosphor 150. Meanwhile, in each case of the embodiments of FIGS. 11 and 12, although the zener diode 170 and the thermister 180 are not shown, it should be understood that these embodiments also include these components.

Figure 13:
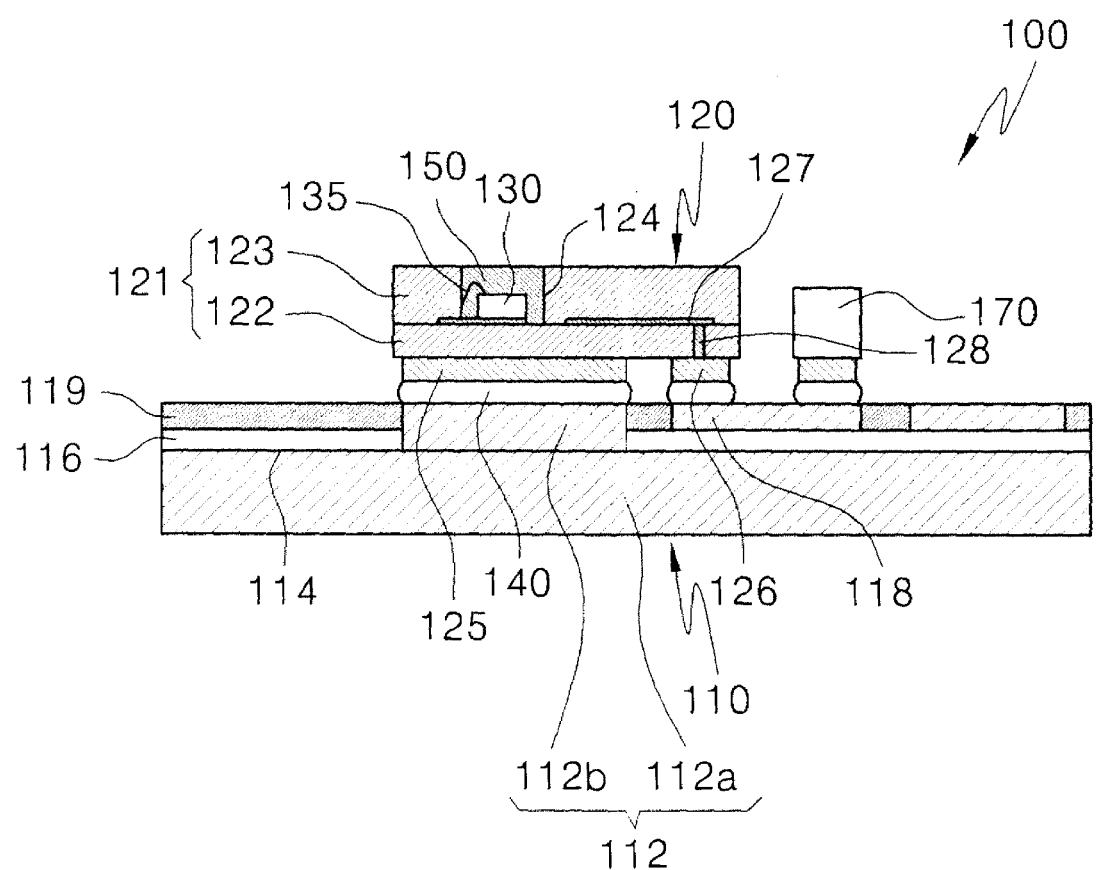

FIG. 13 shows an LED package module 100 in which the heat radiation unit 112 is composed of a flat panel unit 112*a* and a projection unit 112*b*.

In the embodiment of the present invention, as shown in FIG. 13, the heat radiation unit 112 includes the flat panel unit 112*a*, and the projection unit 112*b* formed on a partial position of the flat panel unit 112*a* corresponding to the heat radiation pad 125.

That is, in the case of the embodiment of FIG. 13, as in the embodiment of FIGS. 2, 9, and 12, the projection unit 112*b* is formed on the partial position of the flat panel unit 112*a* with flat both sides in such a manner to be as high as a sum of thicknesses of the insulating unit 116 and the electrode unit 118, instead of formation of the space unit 114 through partial removal of the heat radiation unit 112, so that it is possible to form the space unit 114 on the heat radiation unit 112 in such a manner to substantially have the same depth as the sum of the thicknesses of the insulating unit 116 and the electrode unit 118.

Thus, the formation of the heat radiation unit 112 may be made by separate formation of the projection unit 112*b* and bonding of the formed projection unit 112*b* to the flat panel unit 112*a* through welding. Alternatively, the formation of the heat radiation unit 112 may be made by the formation of the projection unit 112*b* on a partial position of the flat panel unit 112*a* in a plating scheme.

Next, a description will be given of a method for manufacturing the LED package module 200 of a first embodiment in accordance with another aspect of the present invention, with reference to FIGS. 14 to 21.

Figure 14:
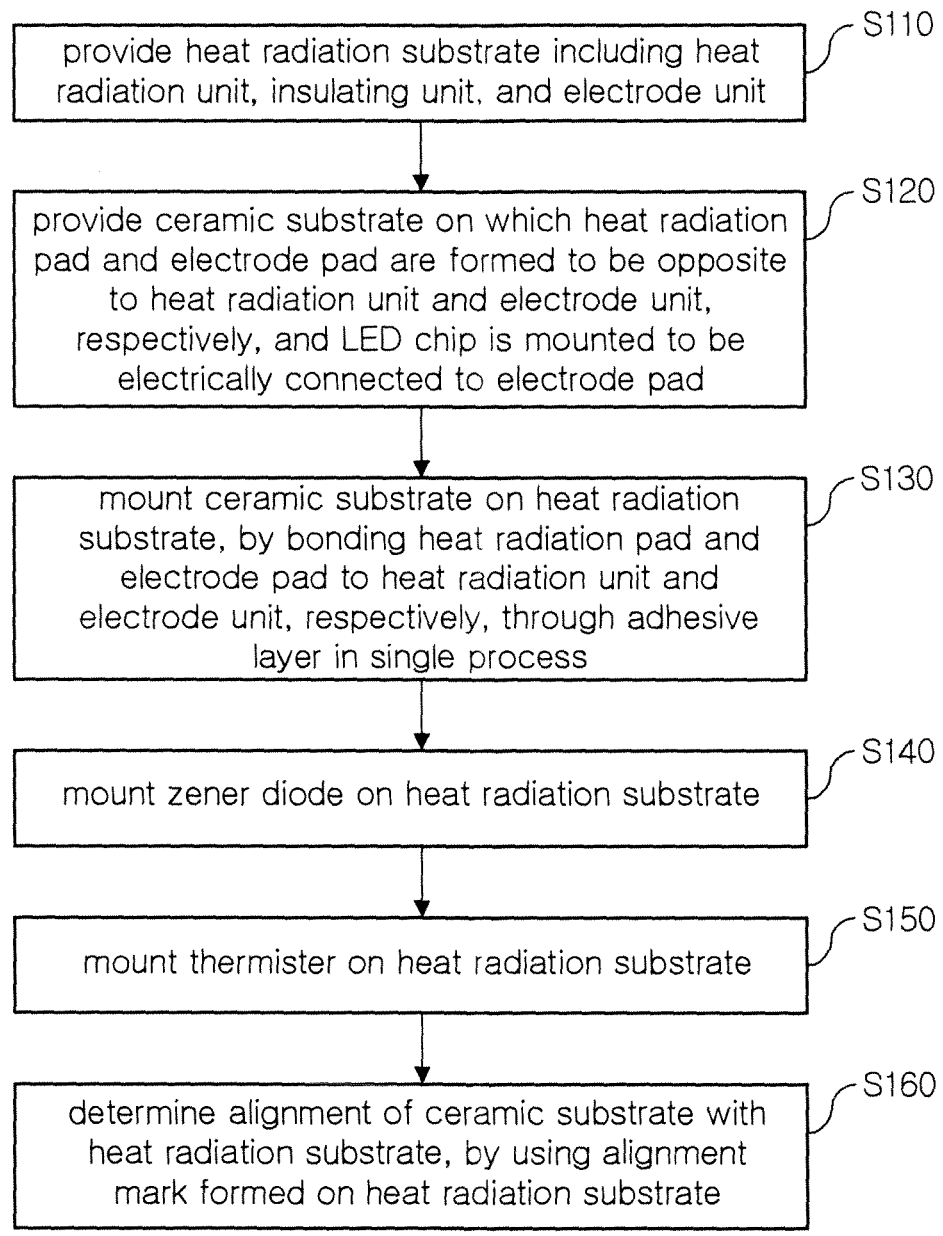
FIG. 14 is a flowchart showing a method for manufacturing an LED package module of a first embodiment in accordance with another aspect of the present invention.

FIG. 14 is a flowchart showing a method for manufacturing the LED package module 200 of the first embodiment in accordance with another aspect of the present invention. FIGS. 15 to 21 are views showing respective processes in the methods for manufacturing the LED package module 200 of the first embodiment in accordance with another aspect of the present invention.

In embodiments in FIGS. 14 to 21, the method for manufacturing the LED package module 200 includes a process for providing the heat radiation substrate 210 (S110), a process for providing the package substrate 221 (S120), a process for mounting the package substrate 221 on the heat radiation substrate 210 (S130), a process for mounting the zener diode 270 on the heat radiation substrate 210 (S140), a process for mounting the thermister 180 on the heat radiation substrate 210 (S150), and a process for determining alignment of the package substrate 221 with the heat radiation substrate 210 (S160).

In the embodiments of present invention, it is possible to simplify a process even without use of a separate wire for electrical-connection between the LED package 220 and the electrode unit 218, which results in remarkable reduction in cost and time required for manufacturing the LED package module 200.

Hereinafter, a detailed description will be given of methods for manufacturing the LED package module 200 in accordance with an embodiment of the present invention, with reference to FIGS. 14 to 21.

In the case of the embodiment of the present invention, the LED package module 200 includes components and function thereof similar to those of the LED package module 100 of FIG. 2, so the detailed description thereof will be omitted and will be mainly described with a process for manufacturing the LED package module 200. Herein the LED package module 200 includes a heat radiation substrate 210, a heat radiation unit 212, a space unit 214, an insulating unit 216, an electrode unit 218, a solder resist layer 219, an LED package 220, a package substrate 221, a first substrate 222, a second substrate 223, a cavity 224, a heat radiation pad 225, an electrode pad 226, a circuit pattern 227, a via 228, an LED chip 230, a conductive adhesive layer 240, a phosphor 250, a glass layer 260, and a zener diode 270.

Figure 15:
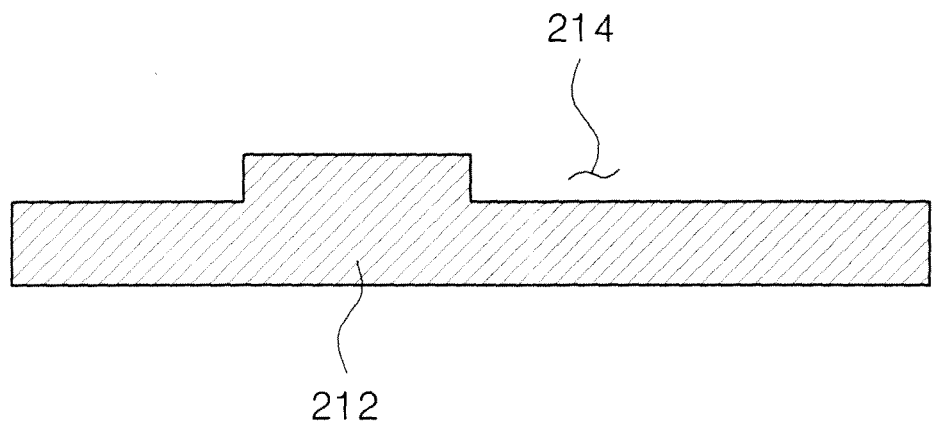
FIGS. 15 to 21 are views showing processes for methods for manufacturing the LED package module of the first embodiment in accordance with another aspect of the present invention, respectively.
Figure 16:
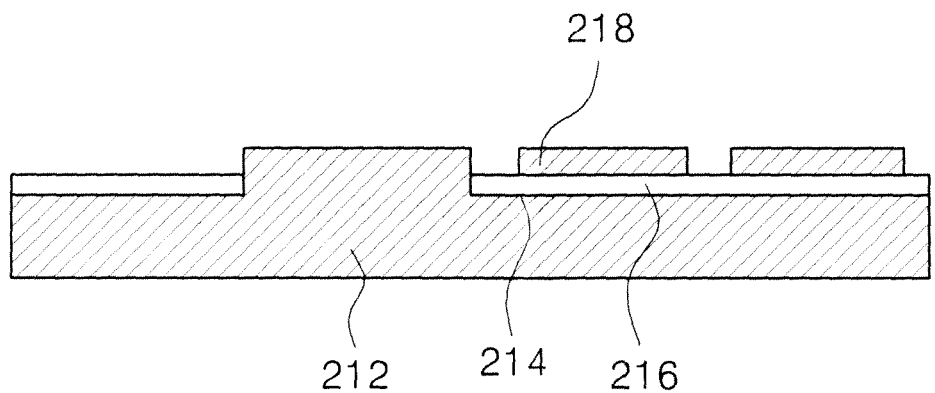
Figure 17:
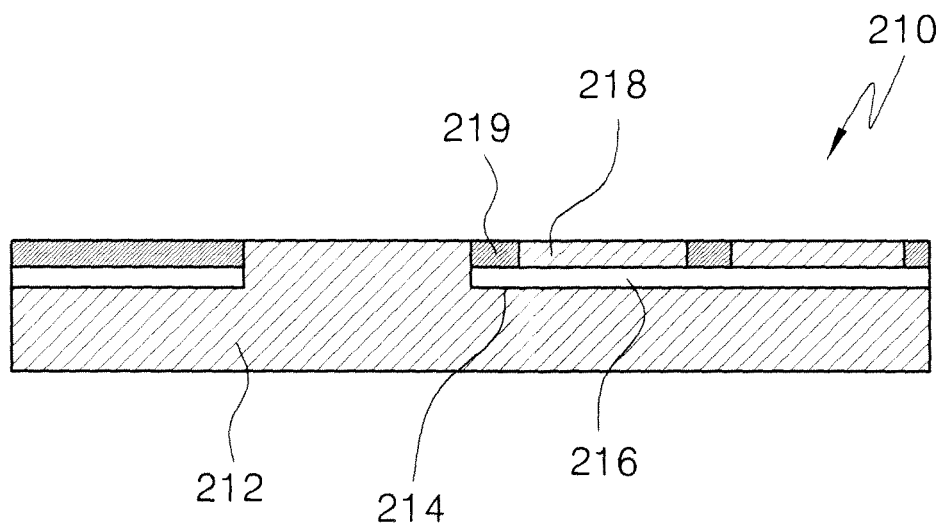

First, as shown in FIGS. 15 to 17, the heat radiation substrate 210 including the heat radiation unit 212, the insulating unit 216, and the electrode unit 218 is provided (S110). This process corresponds to a process for providing the heat radiation substrate 210 including the heat radiation unit 212, the insulating unit 216, and the electrode unit 218. Herein, the heat radiation unit 212 is made of a conductive material and is provided with the space unit 214, and the insulating unit 216 is formed on the space unit 214. The electrode unit 218 is electrically insulated from the heat radiation unit 212 and is formed on the insulating unit 216. This process will be described separately as follows.

First, as shown in FIG. 15, the space unit 214 is formed on some areas of a side facing the package substrate 221 of the heat radiation unit 212. As described above, the space unit 214 may be formed along the edge of the heat radiation unit 212. In this case, the space unit 214 may be formed by partial removal of the heat radiation unit 212 in an etching scheme, or by a laser.

As shown in FIG. 16, the insulating unit 216 is formed within the space unit 214, and then the electrode unit 218 is formed on the insulating unit 216 in such a manner to face the electrode pad 226. The insulating unit 216 may be formed by coating an insulating material on the bottom surface of the space unit 214, or by layering an insulating sheet. The electrode unit 218 may be formed by plating a conductive material on some areas on the insulating unit 216. At the time of formation of the electrode unit 218, both circuits and terminals connected to the electrode unit 218 to thereby be electrically connected to an external controller (not shown) may be formed.

In this case, a surface of the heat radiation unit 212 facing heat radiation pad 225 and a surface of the electrode unit 218 facing the electrode pad 226 are virtually positioned on the same plane. Thus, since the LED package 220 may be effectively mounted on the heat radiation substrate 210 by a single process in an SMT, it is possible to remarkably reduce cost and time for manufacturing.

Thereafter, as shown in FIG. 17, the solder resist layer 219 is formed on the insulating unit 216. That is, the solder resist layer 219 is formed to cover the insulating unit 216 and the electrode unit 218. Then, by a photo-lithography process, a surface of the heat radiation unit 212 facing the heat radiation pad 225, parts on which the zener diode 270 and the thermister 180 of FIG. 1 are to be mounted in circuits connected to the surface of the electrode unit 218 and the electrode unit 218, and terminals connected to these circuits to thereby be electrically connected to external controller (not shown) are exposed to the outside.

Figure 18:
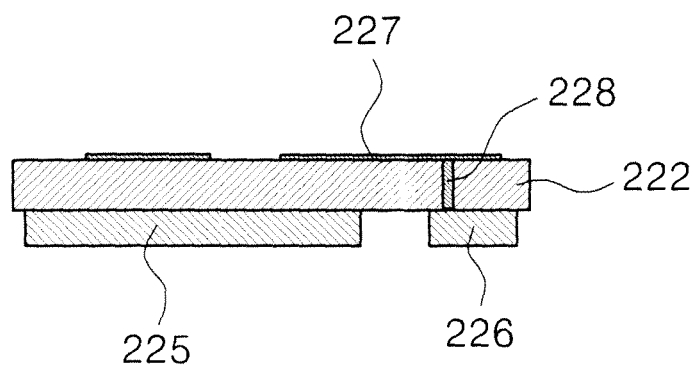
Figure 19:
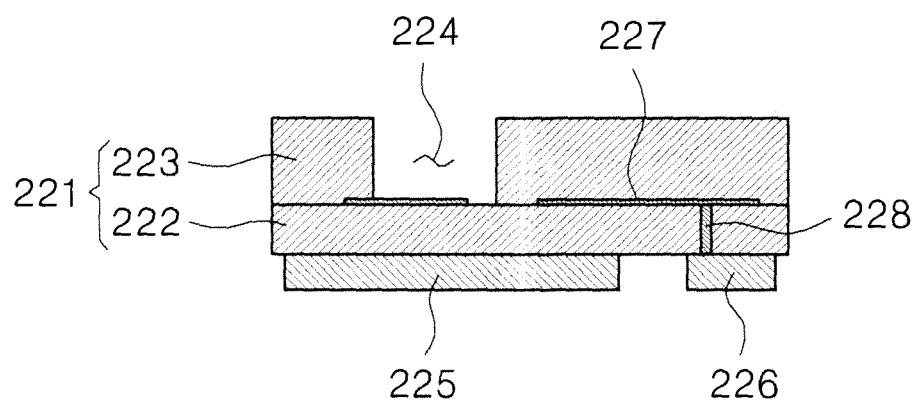
Figure 20:
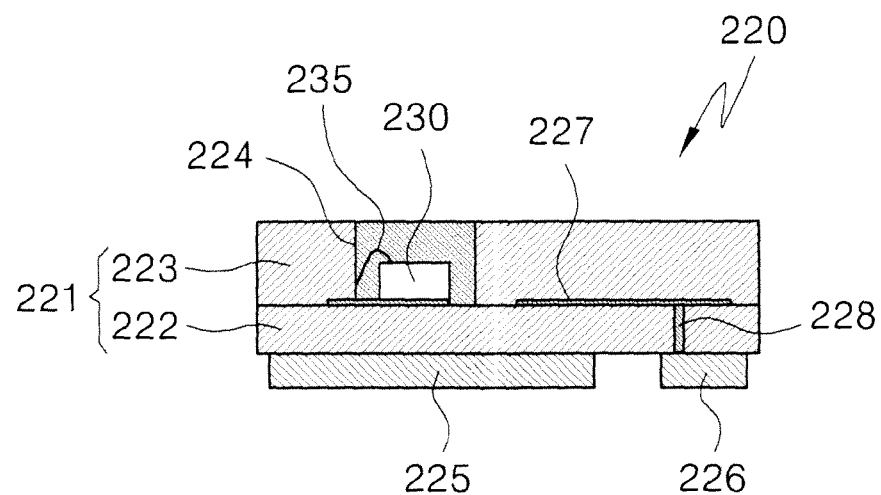

Next, as shown in FIGS. 18 to 20, the heat radiation pad 225 and the electrode pad 226 are formed to face the heat radiation unit 212 and the electrode unit 218, respectively, and the package substrate 221 on which the LED chips 230 are mounted to be electrically connected to the electrode pad 226 is provided (S120). This process will be described separately as follows.

First, as shown in FIG. 18, the heat radiation pad 225 and the electrode pad 226 are formed on the lower surface of the first substrate 222 in the package substrate 221, and the circuit pattern 227 is formed on the upper surface of the first substrate 222 in the package substrate 221 in such a manner to be electrically connected to the LED chips 230. The via 228 is formed within the first substrate 222 of the package substrate 221 in such a manner that the circuit pattern 227 and the circuit pattern 227 are electrically interconnected to each other.

This process is achieved by forming the via hole within the first substrate 222 in such a manner to correspond to positions where the circuit pattern 227 and the electrode pad 226 are to be formed, and filling the via hole with the conductive material at the same time while the circuit pattern 227 is formed on the upper surface of the first substrate 222 and the heat radiation pad 225 and the electrode pad 226 are formed on the lower surface of the first substrate 222. The via 228, the circuit pattern 227, the heat radiation pad 225, and the electrode pad 226 may be formed in various schemes, such as plating, screen printing, inkjet, or so on.

Thereafter, as shown in FIG. 19, the cavity 224 for receiving the LED chip 230 is formed within the second substrate 223, and the second substrate 223 is layered on the first substrate 222. FIG. 19 shows a process for forming a multi-layer package substrate 221 by forming the cavity 224 on a position where the LED chip 230 of the second substrate 223 is to be mounted, and then layering the second substrate 223 on the first substrate 222. In such a process, the circuit pattern 227 formed on the upper surface of the first substrate 222 is exposed to the cavity 224.

Although the first embodiment in accordance with another aspect of the present invention has been described taking an example where the cavity 224 is formed on the second substrate 223 and then the second substrate 223 is layered on the first substrate 222, the scope of the present invention also include a case where the cavity 224 is formed after the second substrate 223 is layered on the first substrate 222.

Next, as shown in FIG. 20, the LED chip 230 is mounted within the cavity 224, and the phosphor 250 is formed on the upper portion of the LED chip 230. The lower electrode of the LED chip 230 is electrically bonded to the circuit pattern 227 exposed to the cavity 224, and the upper electrode of the LED chip 230 is electrically bonded to the circuit pattern 227 by the wire 235. The cavity 224 is filled with the phosphor 250 in order to protect the LED chip 230 and the wire 235.

Although the first embodiment in accordance with another aspect of the present invention has been described taking an example where the phosphor 250 is filled within the cavity 224 in such a manner to cover the LED chip 230, the scope of the present invention may also include a case where the phosphor 250 is formed only on the upper portion of the LED chip 230. In this case, as shown in FIG. 12, the glass layer (indicated by reference numeral 160 of FIG. 12) may be layered to cover the cavity 124.

Figure 21:
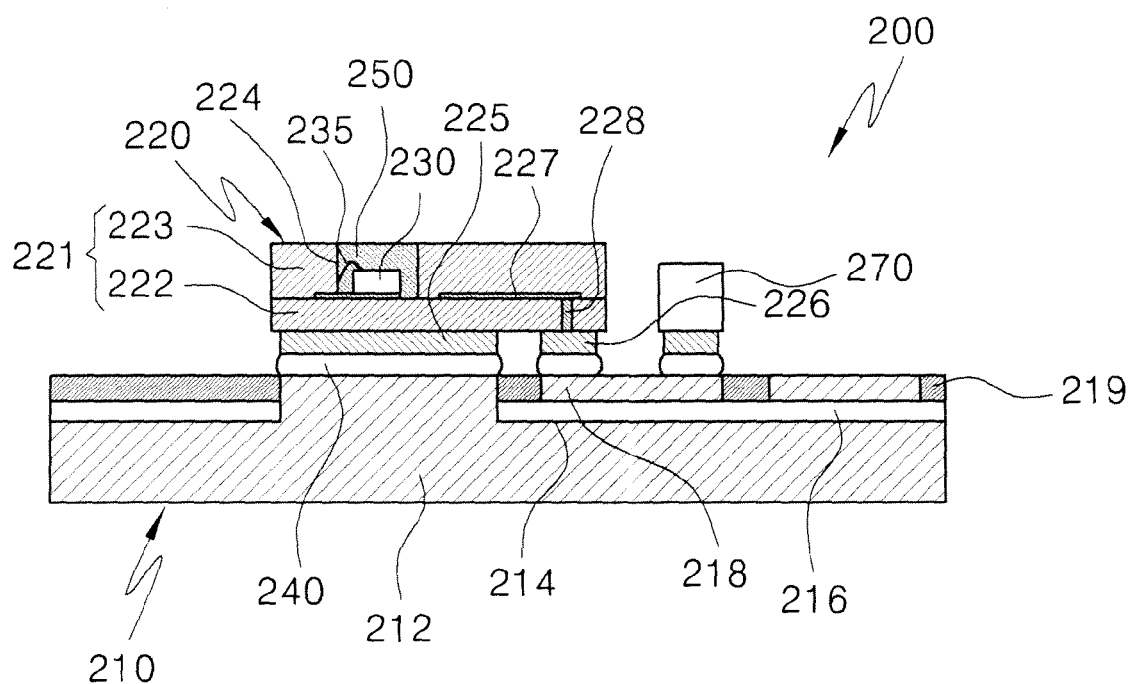

Next, as shown in FIG. 21, the heat radiation pad 225 and the electrode pad 226 are bonded to the heat radiation unit 212 and the electrode unit 218, respectively, in a single process by the conductive adhesive layer 240, and the package substrate 221 is mounted on the heat radiation substrate 210 (S130).

Since the heat radiation pad 225 and the heat radiation unit 212 are formed to face each other and the electrode pad 226 and the electrode unit 218 are formed to face each other, the conductive adhesive layer 240, that is, solder, is interposed therebetween for their bonding.

As such, the heat radiation pad 225 is bonded to the heat radiation unit 212 without interposing the insulating layer, thereby improving heat radiation characteristics of the LED package module 200. Also, the electrode pad 226 is directly bonded to the electrode unit 218 by the interposed solder instead of a wire, thereby simplifying the process and miniaturizing the size in manufacturing the LED package module 200. It is also possible to improve connection-reliability between the electrode unit 218 and the electrode pad 226.

In this case, a process for mounting the package substrate 221 (S130) may be performed by a single process. Thus, it is possible to reduce cost and time for manufacturing. Also, this process is performed by using an SMT, so that it is possible to more effectively reduce cost and time for manufacturing.

Meanwhile, as described above, the surfaces on which the heat radiation unit 212 and the heat radiation pad 225 face each other may be formed to be substantially the same size (width, and length) as each other. Surfaces on which the electrode unit 218 and the electrode pad 226 face each other may be formed to have the same size (width, and length) as each other. The conductive adhesive layer 240 (i.e., solder) of being in a melted state is uniformly interposed between the surfaces on which the heat radiation unit 212 and the heat radiation pad 225 face each other, and between the surfaces on which the electrode unit 218 and the electrode pad 226 face each other, respectively. Then, as the melted conductive adhesive layer 240 becomes cured, they may be bonded to each other.

As such, the sizes of bonded surfaces by the conductive adhesive layer 240 are substantially the same as each other, so that the conductive adhesive layer 240 (solder) provides surface stress to their bonded positions, wherein the conductive adhesive layer 240 of being in a melted state is uniformly interposed between the surface where the heat radiation pad 225 faces the heat radiation unit 212, and between the surface where the electrode pad 226 faces the electrode unit 218.

Therefore, a so-called self-align of the LED package 120 is achievable on the heat radiation substrate 210, so during a process for mounting the package substrate 221 (S130), it is unnecessary to prepare a separate jig for fixing the LED package 120 on a predetermined position, and a separate align mark used to align the LED package 120.

Next, as shown in FIG. 21, the zener diode 270 is mounted on the heat radiation substrate 210 (S140), and the thermister 180 of FIG. 1 is mounted on the heat radiation substrate 210 (S150). That is, the zener diode 270 and the thermister 180 are bonded to the circuits of the heat radiation substrate 210 (indicated by reference numeral 180 of FIG. 1) by using the same conductive adhesive layer 240 as that conductive adhesive layer 240 used to bond the LED package 220 to the heat radiation substrate 210.

This process and the process for mounting the package substrate 221 by an SMT may be simultaneously performed, and it is possible to more effectively reduce cost and time for manufacturing when the LED package 220, the zener diode 270, and the thermister 280 are collectively mounted in such a single process.

Thereafter, alignment or non-alignment of the package substrate 221 with the heat radiation substrate 210 is determined by using an alignment mark (indicated by reference numeral 190 of FIG. 1) formed on the heat radiation substrate 210 (S160). When the process for providing the heat radiation substrate 210 (S110) is performed, a through hole is formed to correspond to a position where the LED chip 230 is to be mounted on the heat radiation substrate 210, and the solder resist layer 219 on areas extended horizontally toward the exposed surface of the heat radiation unit 212 from the through hole is removed. Thus, the insulating unit 216 on the lower portion thereof is exposed and the alignment mark (indicated by reference numeral 190 of FIG. 1) is formed.

Also, the formation of the alignment mark may be achieved by printing a separate material on the solder resist layer 219, as well as by exposing the insulating unit 216 through removal of the solder resist layer 219.

This process aims to recognize an alignment state of the LED chip 230 at final stage of the manufacturing process by using the alignment mark 190 of FIG. 1. Therefore, it should be understood that self-alignment of the LED package 120 is achievable by the process for determining alignment or non-alignment of the alignment mark 190.

Hereinafter, a description will be given of a method for manufacturing the LED package module 200 of a second embodiment in accordance with another aspect of the present invention, with reference to FIGS. 22 to 27.

FIGS. 22 to 27 are cross-sectional views showing respective processes of the method for manufacturing the LED package module 200 in accordance with another aspect of the present invention, respectively.

According to the second embodiment in accordance with another aspect of the present invention, as in the first embodiment in accordance with another aspect of the present invention, the method for manufacturing the LED package module 200 includes a process for providing the heat radiation substrate 210 (S110), a process for providing the package substrate 221 (S120), a process for mounting the package substrate 221 on the heat radiation substrate 210 (S130), a process for mounting the zener diode 270 on the heat radiation substrate 210 (S140), a process for mounting the thermister, indicated by reference numeral 180 of FIG. 1, on the heat radiation substrate 210 (S150), and a process for determining whether or not the package substrate 221 is aligned with the heat radiation substrate 210 (S160).

The above-described processes in the second embodiment in accordance with another aspect of the present invention are merely different from the aforementioned embodiment in terms of details of the processes, which include a process for providing the heat radiation substrate 210 (S110), a process for providing the package substrate 221 (S120), and a process for mounting the package substrate 221 on the heat radiation substrate 210, so the second embodiment in accordance with another aspect of the present invention will be described based on theses differences.

Also, the LED package module 200 of the second embodiment in accordance with another aspect of the present invention includes components and functions thereof similar to those of the LED package module 100 of the first embodiment in accordance with one aspect of the present invention as described above, so the detailed description thereof will be omitted and will be mainly described with a process for manufacturing the LED package module 200. Herein the LED package module 200 includes a heat radiation substrate 210, a heat radiation unit 212, an insulating unit 216, an electrode unit 218, an LED package 220, a package substrate 221, a heat radiation pad 225, an electrode pad 226, a circuit pattern 227, a via 228, an LED chip 230, a conductive adhesive layer 240, a phosphor 250, and a glass layer 260.

Figure 22:
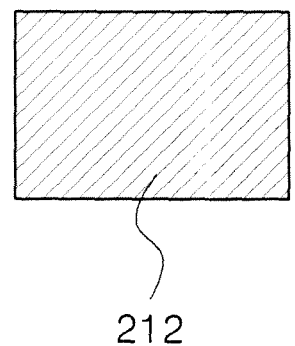
FIGS. 22 to 27 are views showing processes for methods for manufacturing an LED package module of a second embodiment in accordance with another aspect of the present invention, respectively.
Figure 23:
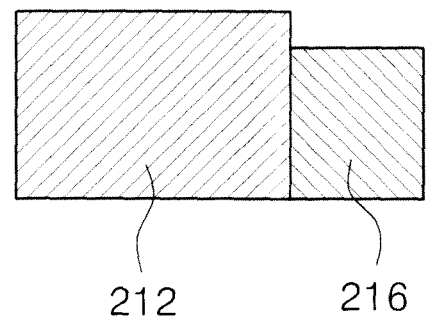
Figure 24:
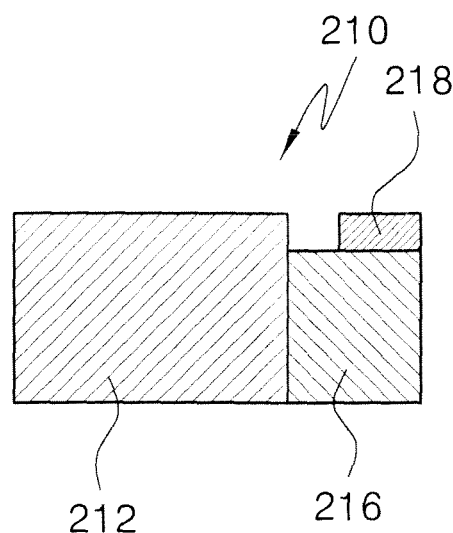

First, as shown in FIGS. 22 to 24, the heat radiation substrate 210 including the heat radiation unit 212, the insulating unit 216, and the electrode unit 218 is provided (S110). This process is a process for providing the heat radiation substrate 210 including the heat radiation unit 212, the insulating unit 216, and the electrode unit 218. Herein, the heat radiation unit 212 is made of a conductive material, and the insulating unit 216 is formed on the outer circumferential surface of the heat radiation unit 212. The electrode unit 218 is electrically insulated from the heat radiation unit 212 and is formed on the insulating unit 216. This process will be described separately as follows.

First, as shown in FIGS. 22 and 23, the insulating unit 216 is formed on the outer circumferential surface of the heat radiation unit 212. That is, the formation of the insulating unit 216 around the heat radiation unit 212 is made without the separate formation of the space unit (indicated by reference numeral 214 of FIG. 15) on the heat radiation unit 212. On the outer circumferential surface of the heat radiation unit 212, the insulating unit 216 is formed to have a height except for thickness enough to form the electrode unit 218. As such, since a process for manufacturing the space unit 214 of FIG. 15 on the heat radiation unit 212 is omitted, it is possible to reduce cost and time required for manufacturing the LED package module 200.

In this case, the insulating unit 216 may be formed to surround the heat radiation unit 212 along the outer circumferential surface of the heat radiation unit 212. Alternatively, the insulating unit 216 may be formed in various configurations.

Next, as shown in FIG. 24, the electrode unit 218 is formed on the insulating unit 216 in such a manner to be opposite to the electrode pad 226. The electrode unit 218 may be formed by plating a conductive material on some areas on the insulating unit 216.

Figure 25:
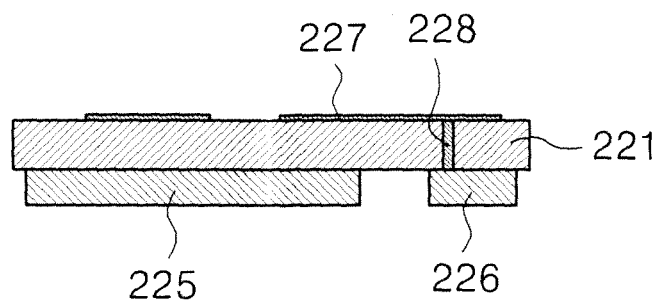
Figure 26:
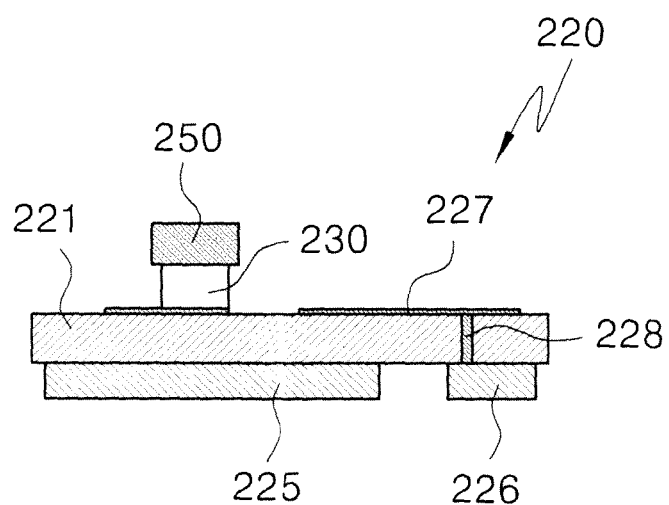

Next, as shown in FIGS. 25 and 26, the heat radiation pad 225 and the electrode pad 226 are formed to be opposite to the heat radiation unit 212 and the electrode unit 218, respectively, and the package substrate 221 on which the LED chip 230 is mounted to be electrically connected to the electrode pad 226 is provided (S120). This process will be described separately as follows.

First, as shown in FIG. 25, the heat radiation pad 225 and the electrode pad 226 are formed on the lower surface of the first substrate 222, and the circuit pattern 227 is formed on the upper surface of the first substrate 222 in such a manner to be electrically connected to the LED chip 230. The via 228 is formed within the first substrate 222 of the package substrate 221 in such a manner that the circuit pattern 227 and the circuit pattern 227 are electrically interconnected to each other. This process may be performed by forming the via hole, and then forming the via 228, the circuit pattern 227, and the heat radiation pad 225, and the electrode pad 226 in various schemes, such as plating, screen printing, inkjet printing, or so on.

Thereafter, as shown in FIG. 26, the LED chip 230 is mounted, and the phosphor 250 is formed on the upper portion of the LED chip 230. Since the LED chip 230 may be bonded to the circuit pattern 227 in a flip chip scheme, the phosphor 250 may be formed only on the upper portion of the LED chip 230.

As such, the mounting of the LED chip 230 in the flip chip scheme brings out omission of a separate construction for protecting the LED chip 230 and the wire, so that it is possible to simplify a process for manufacturing the LED package module 200, and thus to reduce cost and time for manufacturing.

Figure 27:
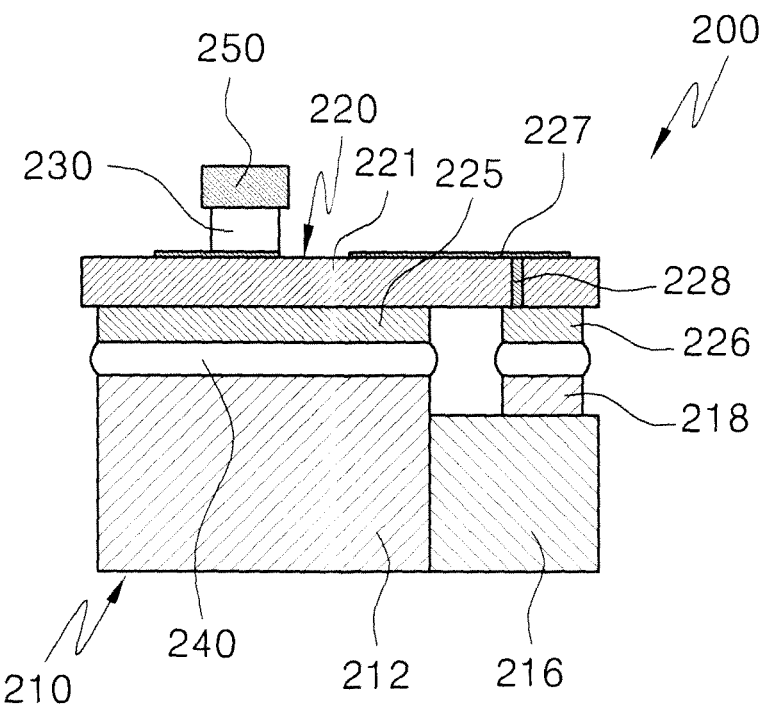

Next, as shown in FIG. 27, the heat radiation pad 225 and the electrode pad 226 are bonded to the heat radiation unit 212 and the electrode unit 218 in a single process by the conductive adhesive layer 240, and the package substrate 221 is mounted on the heat radiation substrate 210 (S130).

The second embodiment in accordance with another aspect of the present invention is different from the aforementioned embodiment in that using paste with a buffering material as the conductive adhesive layer 240, but even if the paste is used, self-alignment effect of the LED package 220 as described above is achievable without change.

That is, when the LED package 220 is mounted on the heat radiation substrate 210 coated with less dried paste with flexibility in such a manner to correspond to positions where the heat radiation pad 225 and the electrode pad 226 are opposite to the heat radiation unit 212 and the electrode unit 218, surface stress of the paste with the flexibility prevents the position of the LED package 220 from being changed on the heat radiation substrate 210 even without a separate jig.

Also, by using the paste with the buffering material as the conductive adhesive layer 240, the paste can serve as buffering even if a coefficient of thermal expansion of the heat radiation unit 212 is slightly different from that of the package substrate 221. Therefore, it is possible to prevent the damage of the LED package module 200.

Next, the zener diode 170 of FIG. 2 is mounted on the heat radiation substrate 210 (S140), and the thermister 180 of FIG. 1 is mounted on the heat radiation substrate 210 (S150). Then, alignment or non-alignment of the package substrate 221 with the heat radiation substrate 210 is determined by using the alignment mark 190 formed on the heat radiation substrate 210 (S160).

According to the present invention, since the insulating layer is omitted between the package substrate and the insulating layer, it is possible to remarkably improve heat radiation efficiency of the heat radiation unit in the LED package. Moreover, it is unnecessary to prepare a wire used for electrical-connection between the LED package and the electrode unit, so that it is possible to improve connection-reliability of the LED package module and the head lamp module, and to reduce its size.

Moreover, non-use of the wire causes simple processes, so that it is possible to remarkably reduce cost and time required for manufacturing the LED package module and the head lamp module.

As described above, although the preferable embodiments of the present invention have been shown and described, it will be appreciated by those skilled in the art that substitutions, modifications and variations may be made in these embodiments without departing from the principles and spirit of the general inventive concept, the scope of which is defined in the appended claims and their equivalents.

What is claimed is:

1. A light emitting diode package module comprising:
    a heat radiation substrate, which includes a heat radiation unit made of a conductive material and an electrode unit electrically insulated from the heat radiation unit;
    a package substrate arranged on the heat radiation substrate;
    a light emitting diode chip mounted on one surface of the package substrate;
    an electrode pad disposed on the other surface of the package substrate and electrically connected to the light emitting diode chip; and
    a heat radiation pad disposed on the other surface of the package substrate and electrically insulated from the electrode pad,
    wherein the electrode pad is bonded to the electrode unit, and the heat radiation pad is bonded to the heat radiation unit.

2. The light emitting diode package module of claim 1, further comprising:

a circuit pattern disposed on the package substrate and electrically connected to the light emitting diode chip; and a via which is disposed on the package substrate and allows the circuit pattern and the electrode pad to be electrically interconnected.

3. The light emitting diode package module of claim 2, wherein the package substrate includes a first substrate and a second substrate layered on the first substrate, the second substrate having the cavity formed therewithin to receive the light emitting diode chip.

4. The light emitting diode package module of claim 3, further comprising a glass layer for covering the cavity.

5. The light emitting diode package module of claim 3, further comprising a phosphor disposed on an upper portion of the light emitting diode chip.

6. The light emitting diode package module of claim 1, wherein the light emitting diode chip includes a plurality of light emitting diode chips, the plurality of light emitting diode chips being electrically interconnected in series to one another.

7. The light emitting diode package module of claim 1, wherein the package substrate is made of a material with ceramic.

8. The light emitting diode package module of claim 1, wherein a surface on which the heat radiation unit faces the heat radiation pad and a surface on which the electrode unit faces the electrode pad are positioned on the same plane.

9. The light emitting diode package module of claim 8, further comprising a conductive adhesive layer interposed between the heat radiation unit and the heat radiation pad, and between the electrode unit and the electrode pad, respectively.

10. The light emitting diode package module of claim 9, wherein surfaces on which the heat radiation unit and the heat radiation pad face to each other have the same size as each other, surfaces on which the electrode unit and the electrode pad face each other have the same size as each other, and the conductive adhesive layer is interposed between the surface on which the heat radiation unit and the heat radiation pad face each other, and between the surface on which the electrode unit and the electrode pad face each other, respectively.

11. The light emitting diode package module of claim 9, wherein the conductive adhesive layer is made of solder.

12. The light emitting diode package module of claim 9, wherein the conductive adhesive layer is made of paste with a buffering material.

13. The light emitting diode package module of claim 1, wherein the heat radiation substrate further comprises an insulating unit interposed between the heat radiation unit and the electrode unit.

14. The light emitting diode package module of claim 13, wherein the heat radiation unit is provided with a space unit, the insulating unit is disposed within the space unit, and the electrode unit is disposed on the insulating unit to be opposite to the electrode pad.

15. The light emitting diode package module of claim 13, wherein the insulating unit is disposed on an outer circumferential surface of the heat radiation unit, and the electrode unit is disposed on the insulating unit to be opposite to the electrode pad.

16. The light emitting diode package module of claim 1, further comprising an alignment mark disposed on the heat radiation substrate in order to determine whether or not the package substrate is aligned with the heat radiation substrate.

17. The light emitting diode package module of claim 1, wherein the heat radiation unit is formed of a material with Cu.

18. The light emitting diode package module of claim 1, wherein the package substrate is formed of a material with ceramic.

19. A head lamp module comprising:
a light emitting diode package module for generating light;
an optical module for changing distribution angle of light generated from the light emitting diode package module;
a heat radiation module for emitting heat of the light emitting diode package to the outside; and
a driver module electrically connected to the light emitting diode package module to thereby control operation of the light emitting diode package module,
wherein the light emitting diode package module comprises:
a heat radiation substrate which includes a heat radiation unit made of a conductive material and an electrode unit electrically insulated from the heat radiation unit;
a package substrate arranged on the heat radiation substrate;
a heat radiation pad disposed on the package substrate to be opposite to the heat radiation unit and bonded to the heat radiation unit;
an electrode pad disposed on the package substrate to be opposite to the electrode unit and bonded to the electrode unit; and
a light emitting diode chip mounted on the package substrate and electrically connected to the electrode pad.

20. A method for controlling the head lamp module of claim 19 comprising the steps of:
generating light irradiated toward the optical module by applying light-emission signals to the light emitting diode package module; and
emitting heat of the light emitting diode package module to the outside by applying the light-emission signals according to change of temperature of the light emitting diode package module.

21. The head lamp module of claim 19, wherein a surface on which the heat radiation unit faces the heat radiation pad and a surface on which the electrode unit faces the electrode pad are positioned on the same plane.

* * * * *